(12) United States Patent
Ishihara et al.

(10) Patent No.: US 10,249,561 B2
(45) Date of Patent: Apr. 2, 2019

(54) PRINTED WIRING BOARD HAVING EMBEDDED PADS AND METHOD FOR MANUFACTURING THE SAME

(71) Applicant: IBIDEN CO., LTD., Ogaki (JP)

(72) Inventors: Teruyuki Ishihara, Ogaki (JP); Haiying Mei, Ogaki (JP); Hiroyuki Ban, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 15/581,253

(22) Filed: Apr. 28, 2017

(65) Prior Publication Data
US 2017/0317017 A1    Nov. 2, 2017

(30) Foreign Application Priority Data

Apr. 28, 2016 (JP) .................................. 2016-091235
Jun. 15, 2016 (JP) .................................. 2016-118687

(51) Int. Cl.
*H01L 23/498*   (2006.01)
*H01L 21/48*    (2006.01)
(Continued)

(52) U.S. Cl.
CPC ...... *H01L 23/49822* (2013.01); *H01L 21/486* (2013.01); *H01L 21/4857* (2013.01); *H01L 21/52* (2013.01); *H01L 23/49816* (2013.01); *H01L 23/49827* (2013.01); *H01L 23/49838* (2013.01); *H01L 23/49894* (2013.01); *H01L 24/09* (2013.01); *H05K 1/181* (2013.01); *H05K 3/4007* (2013.01); *H05K 3/4682* (2013.01); *H01L 2224/0401* (2013.01); *H05K 3/243* (2013.01); *H05K 3/284* (2013.01); *H05K 3/3436* (2013.01); *H05K 2201/0338* (2013.01); *H05K 2201/10378* (2013.01)

(58) Field of Classification Search
CPC ......... H01L 23/49822; H01L 23/49838; H01L 21/486; H01L 24/09; H01L 23/49894; H01L 21/4857; H01L 23/49827; H01L 23/39816; H01L 21/52; H01L 2224/0401; H05K 1/181; H05K 2201/10378
USPC ........ 257/737, 738, 734, 778, 668, 773, 774
See application file for complete search history.

(56) References Cited

U.S. PATENT DOCUMENTS 9,078,384 B2 * 7/2015 Furuichi ............. H05K 3/4682
9,089,041 B2 * 7/2015 Kodani ............... H01L 21/4846
9,215,812 B2 * 12/2015 Kobayashi ......... H01L 21/4857
(Continued)

FOREIGN PATENT DOCUMENTS

JP    2009-224739 A    10/2009

*Primary Examiner* — Alexander Oscar Williams
(74) *Attorney, Agent, or Firm* — Oblon, McClelland, Maier & Neustadt, L.L.P.

(57) ABSTRACT

A printed wiring board includes a support plate, and a build-up wiring layer including resin insulating layers and conductor layers and having a first surface and a second surface on the opposite side with respect to the first surface such that the support plate is positioned on the first surface of the build-up wiring layer. The resin insulating layers in the build-up wiring layer include a first resin insulating layer that forms the second surface of the build-up wiring layer, and the build-up wiring layer includes first conductor pads embedded in the first resin insulating layer such that each of the first conductor pads has an exposed surface exposed from the second surface of the build-up wiring layer.

20 Claims, 22 Drawing Sheets

(51) Int. Cl.
  *H05K 1/18* (2006.01)
  *H01L 21/52* (2006.01)
  *H01L 23/00* (2006.01)
  *H05K 3/40* (2006.01)
  *H05K 3/46* (2006.01)
  *H05K 3/24* (2006.01)
  *H05K 3/28* (2006.01)
  *H05K 3/34* (2006.01)

(56) References Cited

U.S. PATENT DOCUMENTS

| | | | | |
|---|---|---|---|---|
| 9,258,899 B2* | 2/2016 | Kaneko | | H01L 23/49838 |
| 2008/0289866 A1* | 11/2008 | Yuri | | H01L 23/49822 |
| | | | | 174/260 |
| 2009/0078451 A1* | 3/2009 | Niki | | H05K 3/0058 |
| | | | | 174/250 |
| 2009/0242261 A1* | 10/2009 | Takenaka | | H05K 1/0271 |
| | | | | 174/262 |
| 2010/0084163 A1* | 4/2010 | Kodani | | H01L 21/4846 |
| | | | | 174/250 |
| 2015/0156881 A1* | 6/2015 | Shimizu | | H05K 3/30 |
| | | | | 174/255 |
| 2015/0340309 A1* | 11/2015 | Furutani | | H01L 23/49822 |
| | | | | 361/760 |
| 2016/0088727 A1* | 3/2016 | Furutani | | H05K 3/4673 |
| | | | | 361/783 |
| 2016/0143134 A1* | 5/2016 | Tomikawa | | H05K 1/0204 |
| | | | | 174/255 |
| 2016/0164159 A1* | 6/2016 | Inagaki | | H05K 1/0296 |
| | | | | 333/238 |
| 2016/0233167 A1* | 8/2016 | Shimizu | | H01L 23/5383 |
| 2017/0033036 A1* | 2/2017 | Kajihara | | H01L 23/49827 |
| 2017/0256482 A1* | 9/2017 | Furuichi | | H01L 21/486 |
| 2017/0257952 A1* | 9/2017 | Adachi | | H05K 3/3452 |

* cited by examiner

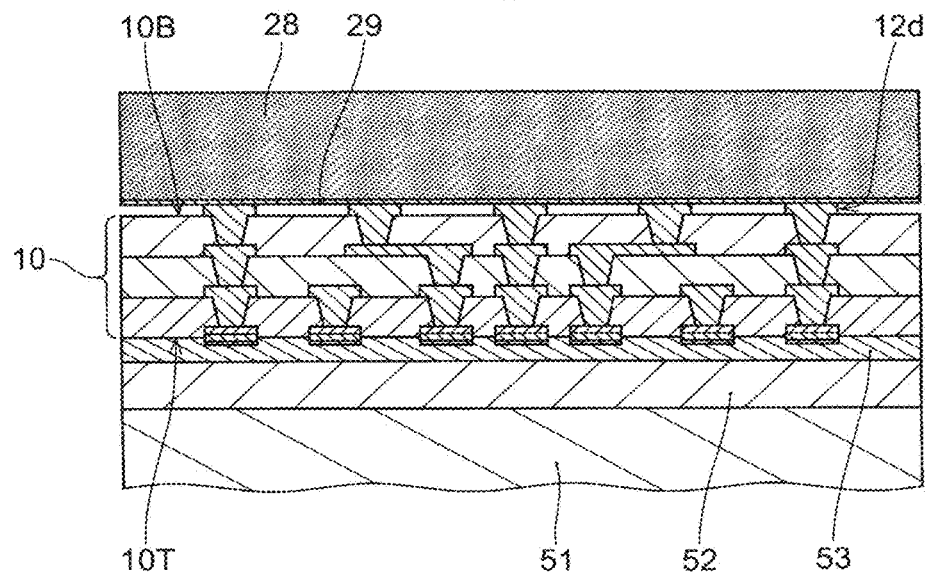
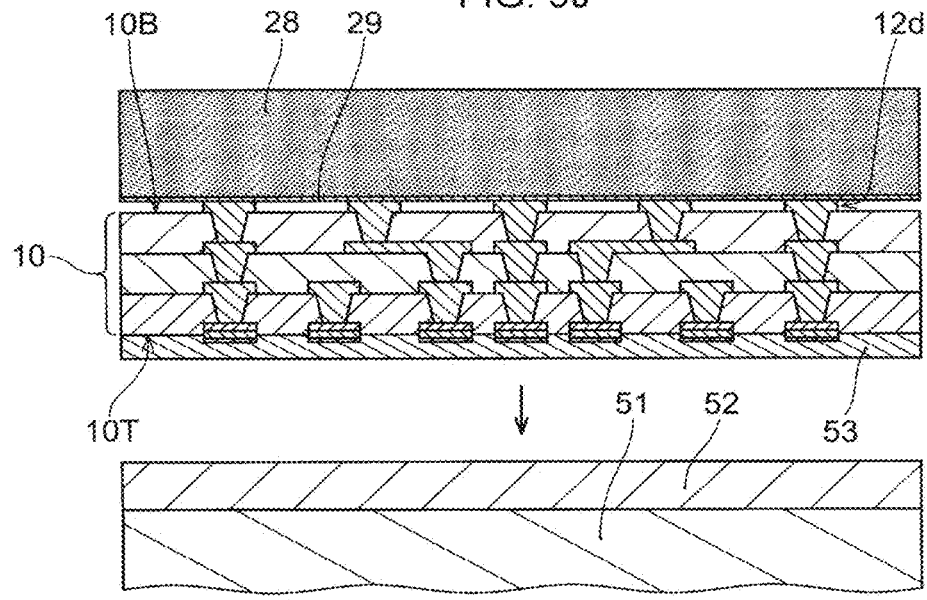

PRINTED WIRING BOARD HAVING EMBEDDED PADS AND METHOD FOR MANUFACTURING THE SAME

CROSS-REFERENCE TO RELATED APPLICATIONS

The present application is based upon and claims the benefit of priority to Japanese Patent Applications No. 2016-091235, filed Apr. 28, 2016 and No. 2016-118687, filed Jun. 15, 2016. The entire contents of these applications are incorporated herein by reference.

BACKGROUND OF THE INVENTION

Field of the Invention

The present invention relates to a printed wiring board having via conductors and relates to a method for manufacturing the printed wiring board.

Description of Background Art

Japanese Patent Laid-Open Publication No. 2009-224739 describes a multilayer wiring board that does not have a core substrate. In the multilayer wiring board of Japanese Patent Laid-Open Publication No. 2009-224739, an insulating layer having a bonding surface for an external connection terminal is formed as an insulating layer that contains a glass cloth, and an insulating layer having a mounting surface for a semiconductor element is formed as an insulating layer that does not contain a glass cloth. The entire contents of this publication are incorporated herein by reference.

SUMMARY OF THE INVENTION

According to one aspect of the present invention, a printed wiring board includes a support plate, and a build-up wiring layer including resin insulating layers and conductor layers and having a first surface and a second surface on the opposite side with respect to the first surface such that the support plate is positioned on the first surface of the build-up wiring layer. The resin insulating layers in the build-up wiring layer include a first resin insulating layer that forms the second surface of the build-up wiring layer, and the build-up wiring layer includes first conductor pads embedded in the first resin insulating layer such that each of the first conductor pads has an exposed surface exposed from the second surface of the build-up wiring layer.

According to another aspect of the present invention, a method for manufacturing a printed wiring board includes preparing a base plate including a metal film forming a surface of the base plate, forming a metal layer including conductor pads such that the metal layer is formed on the metal film of the base plate, forming a build-up wiring layer on the metal film of the base plate such that the build-up wiring layer covers the metal layer including the conductor pads, removing the base plate from the build-up wiring layer such that the metal film of the base plate remains on the build-up wiring layer, bonding a support plate on a first surface of the build-up wiring layer on the opposite side with respect to a second surface of the build-up wiring layer on which the metal film remains, and removing the metal film from the second surface of the build-up wiring layer such that each of the conductor pads has an exposed surface from the second surface of the build-up wiring layer. The forming of the build-up wiring layer includes laminating resin insulating layers and conductor layers on the metal film of the base plate such that a resin insulating layer of the resin insulating layers covers surfaces including side surfaces of the conductor pads exposed on the metal film and that the build-up wiring layer including the resin insulating layers and the conductor layers is formed on the metal film of the base plate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 9A-9K illustrate a method for manufacturing a printed wiring board according to another embodiment of the present invention;

DETAILED DESCRIPTION OF THE EMBODIMENTS

Figure 1:
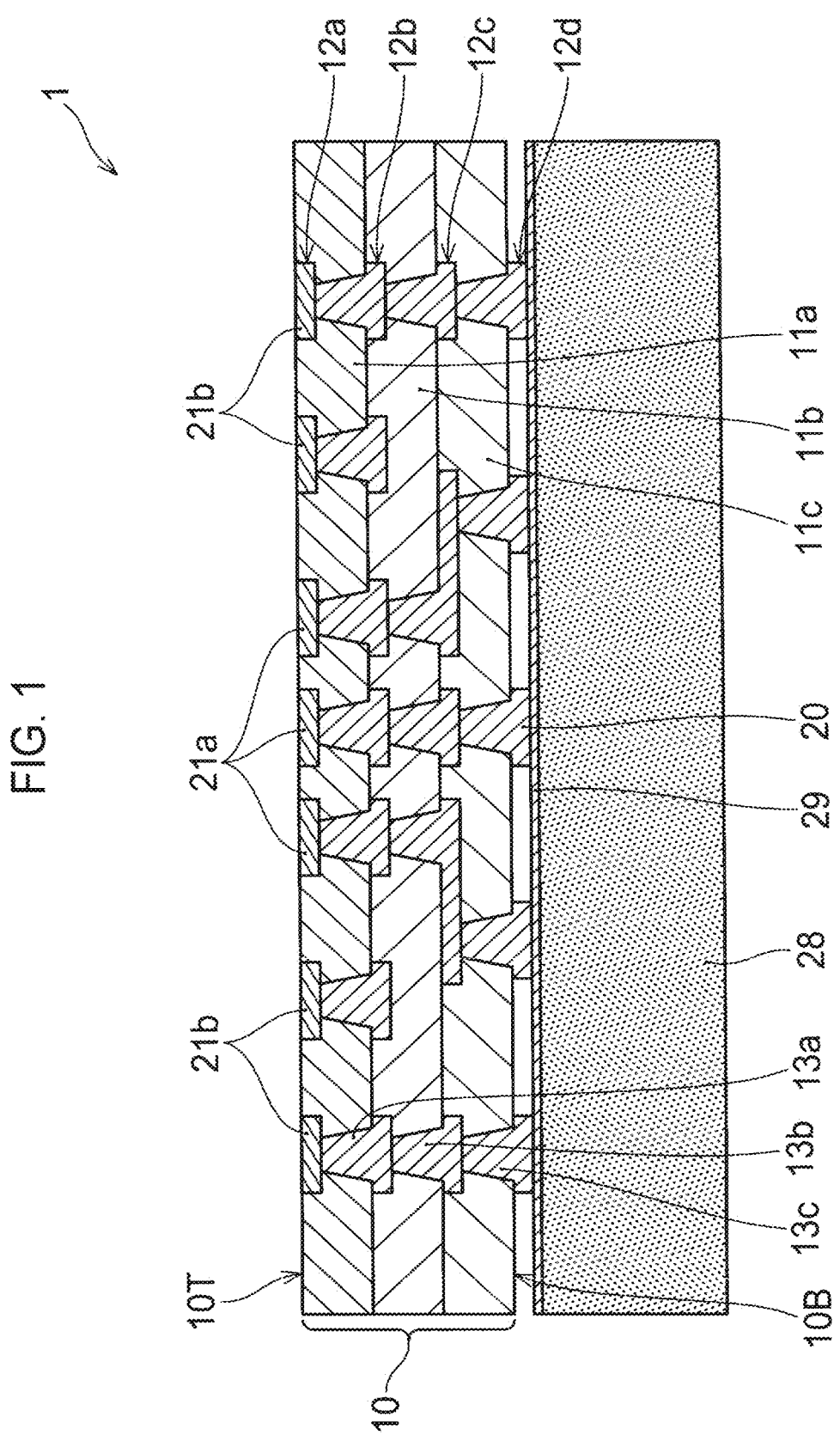
FIG. 1 is a cross-sectional view of a printed wiring board according to an embodiment of the present invention.

The embodiments will now be described with reference to the accompanying drawings, wherein like reference numerals designate corresponding or identical elements throughout the various drawings.

FIG. 1 describes a cross section of a printed wiring board 1 according to an embodiment of the present invention. As illustrated in FIG. 1, the printed wiring board 1 includes a build-up wiring layer 10 that has a first surface (10B) and a second surface (10T) that is on the opposite side of the first surface (10B), and a support plate 28 that is formed on the first surface (10B), resin insulating layers (a first resin insulating layer (11a), a second resin insulating layer (11b), and a third resin insulating layer (11c)) and conductor layers (a second conductor layer (12b), a third conductor layer (12c), and a fourth conductor layer (12d)) being alternately laminated in the build-up wiring layer 10. Multiple first conductor pads (21a) and multiple second conductor pads (21b) for connecting to an external electrical circuit are formed on the second surface (10T) of the build-up wiring layer 10. In the example illustrated in FIG. 1, the multiple first conductor pads (21a) are formed on a center side of the second surface (10T) of the build-up wiring layer 10, and the multiple second conductor pads (21b) are formed on an outer peripheral side of the second surface (10T). In the example of FIG. 1, from the second surface (10T) side of the build-up wiring layer 10 toward the first surface (10B) side, sequentially, a first conductor layer (12a), the first resin insulating layer (11a), the second conductor layer (12b), the second resin insulating layer (11b), the third conductor layer (12c), the third resin insulating layer (11c), and the fourth conductor layer (12d) are laminated. A surface of the first resin insulating layer (11a) on the opposite side of the second conductor layer (12b) side forms the second surface (10T) of the build-up wiring layer 10. The first conductor layer (12a) includes the first conductor pads (21a) and the second conductor pads (21b). The first conductor layer (12a) is formed, for example, by electrolytic plating using a plating resist having an opening at a formation region of a predetermined conductor pattern. Since etching is not used, the conductor pattern can be formed at a fine pitch in the first conductor layer (12a). The fourth conductor layer (12d) includes third conductor pads 20.

The first conductor layer (12a) is embedded in the first resin insulating layer (11a) with one surface exposed on the second surface (10T) of the build-up wiring layer 10. In this way, embedding the first conductor layer (12a) in the first resin insulating layer (11a) contributes to reduction in thickness of the printed wiring board 1. Further, adhesion between the first conductor layer (12a) and the first resin insulating layer (11a) is improved. In the example of FIG. 1, side surfaces of the first and second conductor pads (21a, 21b) are covered by the first resin insulating layer (11a). Contact between bonding members composed of solder or the like of adjacent conductor pads is unlikely to occur. Even when the conductor pads are formed at a fine pitch, short circuit failure is unlikely to occur. On the other hand, the fourth conductor layer (12d) is formed on the third resin insulating layer (11c). That is, the third conductor pads 20 are formed protruding on the first surface (10B) of the build-up wiring layer 10.

As illustrated in FIG. 1, the printed wiring board 1 of the embodiment includes the support plate 28 on the first surface (10B) of the build-up wiring layer 10. The printed wiring board 1 including the build-up wiring layer 10 is supported by the support plate 28. For example, connection of an external electrical component to the printed wiring board 1 via the first conductor pads (21a) and/or the second conductor pads (21b) is likely to be easy. In the example of FIG. 1, the support plate 28 is affixed to the fourth conductor layer (12d) on the third resin insulating layer (11c) by an adhesive 29. The adhesive 29 is not particularly limited. However, as will be described later, in a case where the support plate 28 is removed such as when the printed wiring board 1 is in use, an adhesive that has moderate adhesiveness but does not have a strong adhesive force with respect to the fourth conductor layer (12d) is preferred. A material that at least can develop a strong adhesive force with the support plate 28 other than the fourth conductor layer (12d) is preferable. The support plate 28 may also be bonded to the build-up wiring layer 10 by any measures other than the adhesive 29.

The third conductor pads 20 on the first surface (10B) of the build-up wiring layer 10 can also be connected to an external electrical circuit such as an electronic component or a motherboard. When the third conductor pads 20 are connected to an external electrical circuit or the like, a part of or the whole of the support plate 28 is removed before the connection.

Figure 2:
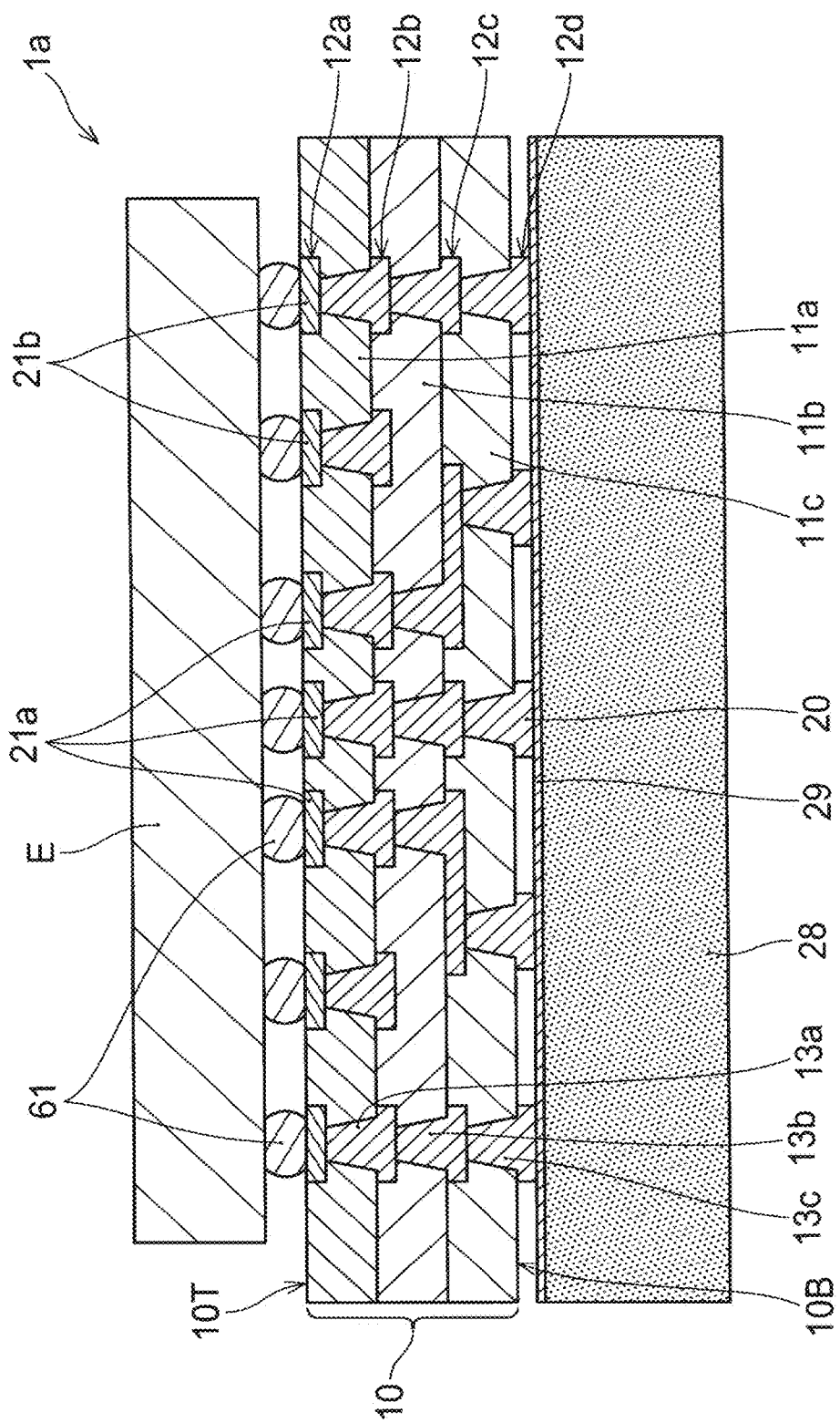
FIG. 2 is a cross-sectional view illustrating a printed wiring board according to another embodiment of the present invention.

FIG. 2 illustrates a printed wiring board (1a) having an electronic component (E) that is on the first conductor pads (21a) and the second conductor pads (21b) of the printed wiring board 1. Examples of the electronic component (E) include a bare chip of a semiconductor element, passive elements (such as a capacitor and a resistor), an interposer having a wiring layer, a semiconductor element having a rewiring layer, a WLP (Wafer Level Package), and other forms of integrated circuit devices. Further, instead of the electronic component (E), a motherboard of an electrical equipment in which the printed wiring board 1 is used, or an external wiring board such as a wiring board that forms a package of an external electronic component, may be connected to the first and second conductor pads (21a, 21b).

In the example of FIG. 2, due to the support plate 28 provided on the first surface (10B) of the build-up wiring layer 10, warping and deflection of the printed wiring board (1a) is suppressed. Therefore, when the electronic component (E) is mounted, multiple electrodes of the electronic component (E) can be respectively substantially uniformly brought close to the multiple first and second conductor pads (21a, 21b). The electrodes of the electronic component (E) are unlikely to float from the first and second conductor pads (21a, 21b). Since flatness of the second surface (10T) of the build-up wiring layer 10 is maintained, positional deviation of the electronic component (E) is unlikely to occur. Further, in such a component mounting process and in a manufacturing process of the printed wiring board (1a) itself, the printed wiring board (1a) can be easily handled. Terminals of the electronic component (E) are respectively connected to exposed surfaces of the first and second conductor pads (21a, 21b) on the opposite side of the first surface (10B) via bonding members 61 composed of solder or the like.

By providing the support plate 28, even when conductor posts are formed on the second conductor pads (21b) in order to connect the printed wiring board 1 of the embodiment to a motherboard or another printed wiring board or the like, the formation of the conductor posts is likely to be easy. As a result, connection reliability of the printed wiring board 1 of the embodiment is likely to be improved. The support plate 28 can be removed, such as after the electronic component (E) is mounted on the printed wiring board 1. That is, connection reliability between the printed wiring board 1 and the electronic component (E) or the like can be improved without causing an increase in the thickness of the printed wiring board 1 during use.

In the example illustrated in FIG. 1, the build-up wiring layer 10 include three resin insulating layers and a total of four conductor layers that are respectively formed on surfaces of the resin insulating layers. That is, FIG. 1 illustrates an example of the build-up wiring layer 10 having a so-called four-layered. However, the number of the resin insulating layers and the number of the conductor layers are not limited to this example, and can be appropriately selected according to a circuit structure. The build-up wiring layer 10 may be a build-up wiring layer having a two-layer structure formed by one resin insulating layer and two conductor layers laminated on both sides of the resin insulating layer, or may be a build-up wiring layer that includes five or more conductor layers. By allowing the build-up wiring layer 10 to include more conductor layers, without increasing a planar size of the printed wiring board 1, a larger and more complex electrical circuit can be formed in the printed wiring board 1.

First via conductors (13*a*), second via conductors (13*b*), and third via conductors (13*c*) respectively connect between the first conductor layer (12*a*) and the second conductor layer (12*b*), between the second conductor layer (12*b*) and the third conductor layer (12*c*), and between the third conductor layer (12*c*) and the fourth conductor layer (12*d*). The first via conductors (13*a*), the second via conductors (13*b*), and the third via conductors (13*c*) are respectively formed in the first resin insulating layer (11*a*), the second resin insulating layer (11*b*), and the third resin insulating layer (11*c*). As will be described later, the via conductors are respectively formed in conduction holes that are each formed, for example, by irradiating a laser beam to one side of a respective resin insulating layer. The conduction holes each have a diameter that is larger on a laser beam irradiation side and become smaller on a deep side (opposite side of the laser beam irradiation side). In the example illustrated in FIG. 1, since the laser beam is irradiated from a lower side in the drawing, the diameter (width) on the lower side of each of the conduction holes is larger and the diameter (width) on an upper side is smaller. Therefore, the via conductors that are respectively formed in the conduction holes also each have a width (diameter) that is larger on a lower side and is smaller on an upper side. In the example illustrated in FIG. 1, the via conductors are each formed in a tapered shape that is reduced in diameter from the first surface (10B) toward the second surface (10T) of the build-up wiring layer 10. The reduced diameter sides of the tapered shapes of the first via conductors (13*a*) are connected to the first conductor layer (12*a*).

As in the example of FIG. 1, when the build-up wiring layer 10 includes multiple resin insulating layers, the resin insulating layers (first, second and third resin insulating layers (11*a*, 11*b*, 11*c*)) are preferably formed of the same resin material. However, it is also possible that mutually different resin materials are used. The resin insulating layers can each be formed, for example, by applying heat and pressure to a resin material such as a film for interlayer insulation. Or, the material of each of the resin insulating layers may be a prepreg in a semi-cured state obtained by impregnating a core material such as glass fiber with a resin material. Warping due to a difference in thermal expansion coefficient with respect to the electronic component can be easily prevented. A preferred example of the resin material is an epoxy resin. The epoxy resin may contain inorganic filler such as silica ($SiO_2$) or alumina. The resin insulating layers (11*a*, 11*b*, 11*c*) each have a thickness of, for example, 3 μm or more and 25 μm or less.

As will be described later, the conductor layers (first, second, third and fourth conductor layers (12*a*, 12*b*, 12*c*, 12*d*)) are each formed, for example, by electrolytic plating. By using a so-called semi-additive method, fine patterns are precisely formed. As a result, in particular, requirements for a high density and a fine pitch are satisfied. An example of a material of the conductor layers formed by electrolytic plating is copper. The material of the conductor layers may also be other metals such as nickel. The first-fourth conductor layers (12*a*, 12*b*, 12*c*, 12*d*) each have a thickness of, for example, 3 μm or more and 20 μm or less.

Further, although not illustrated in FIGS. 1 and 2, it is also possible that the first and second conductor pads (21*a*, 21*b*) are each formed from two or more metal layers composed of different metals. For example, the first and second conductor pads (21*a*, 21*b*) are each formed such that a corrosion resistant plating layer composed of highly corrosion resistant gold is exposed from the second surface (10T) of the build-up wiring layer 10.

Corrosion resistance of the conductor pads is likely to be improved. An example of a manufacturing method will be described later.

Figure 3:
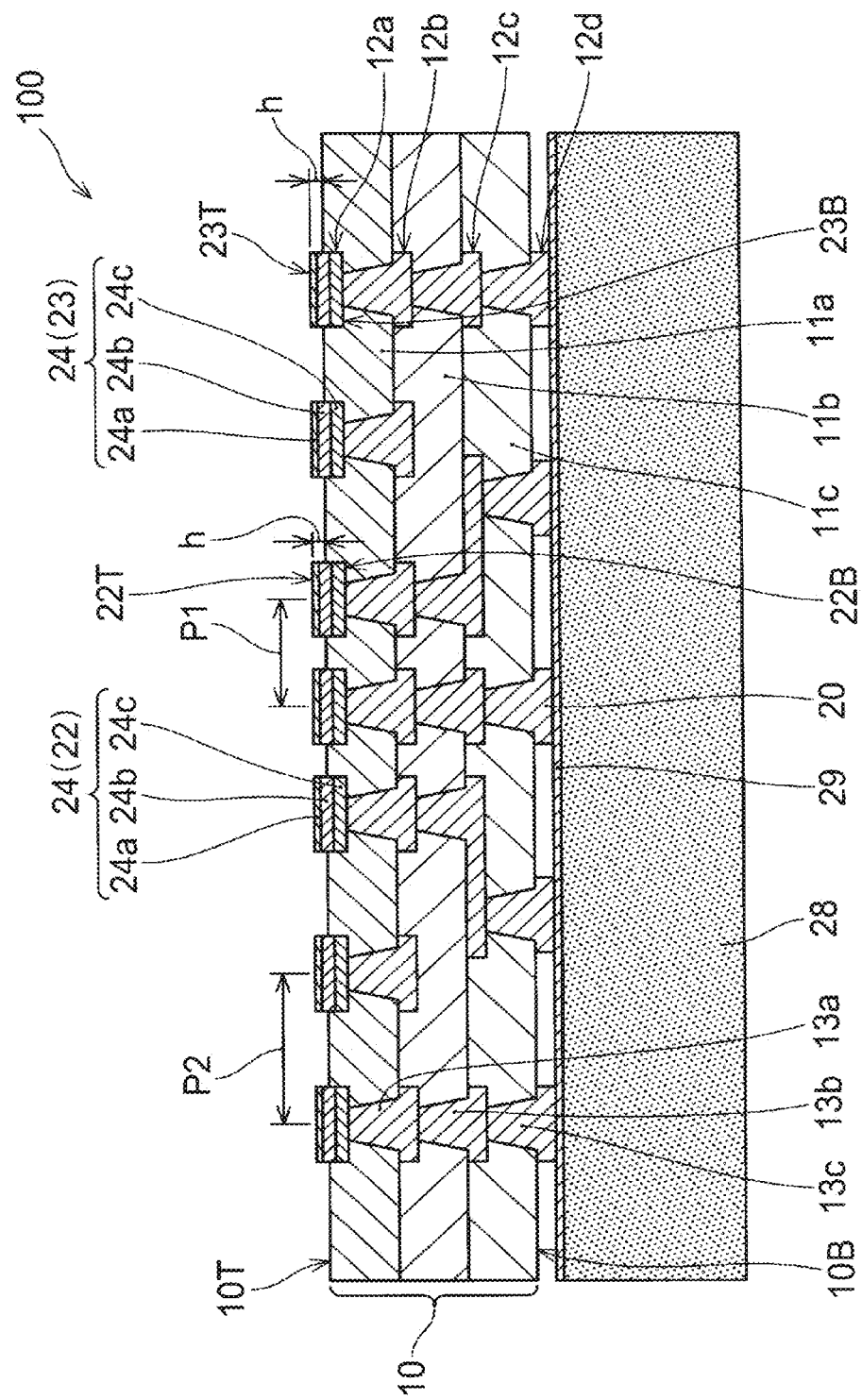
FIG. 3 is a cross-sectional view illustrating a printed wiring board according to another embodiment of the present invention.

FIG. 3 is a cross-sectional view similar to FIG. 1 illustrating another embodiment of the present invention. In a printed wiring board 100, similar to the printed wiring board 1 of FIG. 1, first conductor pads 22 are formed on a center side of the second surface (10T) of the build-up wiring layer 10, and second conductor pads 23 are formed on an outer peripheral side of the second surface (10T). The first conductor pads 22 can be connected, for example, to an electronic component (E1) (see FIG. 4) such as a semiconductor element, and the second conductor pads 23 can be connected, for example, to another printed wiring board (not illustrated in the drawings) or the like. Or, it is also possible that one electronic component is mounted on the first conductor pads 22 and the second conductor pads 23. In the example of FIG. 3, the first conductor pads 22 and the second conductor pads 23 are each formed of a dissimilar metal layer 24 that is formed by laminating two or more layers composed of mutually different metals. The first conductor pads 22 and the second conductor pads 23 are each formed protruding from the second surface (10T). It is thought that a solder short or the like between the pads is unlikely to occur. Further, mounting of an electronic component or the like on the printed wiring board 100 is likely to be easy. The first conductor pads 22 and the second conductor pads 23 form the first conductor layer (12*a*). Similar to the first conductor layer (12*a*) of the printed wiring board 1 illustrated in FIG. 1, the first conductor layer (12*a*) of the printed wiring board 100 is embedded in the first resin insulating layer (11*a*), and a portion of the first conductor layer (12*a*) is exposed from the first resin insulating layer (11*a*).

In the example illustrated in FIG. 3, the dissimilar metal layer 24 is formed by sequentially laminating three metal layers including, from a side farthest from the first surface (10B), a first metal layer (24*a*), a second metal layer (24*b*) and a third metal layer (24*c*) in a thickness direction of the build-up wiring layer 10. The first-third metal layers (24*a*-24*c*) are preferably each formed by a plating layer. For example, the first-third metal layers (24*a*-24*c*) are each an electrolytic plating film.

In the example illustrated in FIG. 3, the dissimilar metal layer 24 is formed form three layers including the first metal layer (24*a*) composed of gold, the second metal layer (24*b*) composed of nickel and the third metal layer (24*c*) composed of copper. The first metal layer (24*a*) is an outermost layer of each of the first conductor pads 22 and the second conductor pads 23 on the opposite side of the first surface (10B). However, the number of layers of the dissimilar metal layer 24 is not limited to this example. For example, it is also possible that an additional metal layer is formed between the first metal layer (24*a*) and the second metal layer (24*b*), and the dissimilar metal layer 24 is formed by four or more metal layers. For example, an additional metal layer can be formed of a metal layer composed of palladium. The dissimilar metal layer 24 may be a metal layer having a multilayer structure formed by laminating at least two layers composed of mutually different metals. For example, the dissimilar metal layer 24 can be formed from a metal layer that is formed by a copper plating film on the first surface (10B) side and a corrosion resistant metal layer that is laminated on the metal layer. The dissimilar metal layer 24 can be formed such that, for example, the first metal layer (24a) has a thickness of 0.3 μm or more and 1 μm or less, the second metal layer (24b) has a thickness of 3 μm or more and 7 μm or less, and the third metal layer (24c) has a thickness of 4 μm or more and 6 μm or less. However, it is also possible that the metal layers have the same thickness. Preferably, as illustrated in FIG. 3, the first metal layer (24a), which is the outermost layer, is formed thinnest.

The first metal layer (24a), which is the outermost layer, is preferably formed of metal having low contact resistance and high corrosion resistance. Therefore, the first metal layer (24a) is preferably a highly corrosion resistant gold plating layer. Corrosion resistance and oxidation resistance of the first and second conductor pads (22, 23) are improved. For example, during mounting of an electronic component or the like, a solder failure caused by oxidation of the pads is unlikely to occur.

In the printed wiring board 100 of the embodiment, the metal layers in each of the dissimilar metal layers 24 that respectively form the first conductor pads 22 and the second conductor pads 23 are each formed by electrolytic plating. Therefore, variation in heights of the formed dissimilar metal layers 24 is likely to be small. As a result, for example, variation in distances between electrodes of an electronic component such as a semiconductor element to be mounted on the printed wiring board 100 and upper surfaces (22T) of the first conductor pads 22 on the opposite side of the first surface (10B) is reduced. High reliability in the connection between the electronic component and the first conductor pads 22 can be provided. An example of a manufacturing method will be described later.

As illustrated in FIG. 3, the first conductor pads 22 and the second conductor pads 23 are provided in the first conductor layer (12a). A portion of each of the first conductor pads 22 including the upper surface (22T) on the opposite side of the first surface (10B) and a portion of each of the second conductor pads 23 including an upper surface (23T) on the opposite side of the first surface (10B) are formed protruding from the second surface (10T) of the build-up wiring layer 10. A portion of each of the first conductor pads 22 including a lower surface (22B) on the first surface (10B) side and a portion of each of the second conductor pads 23 including a lower surface (23B) on the first surface (10B) side are embedded in the first resin insulating layer (11a) and are connected to respective first via conductors (13a).

In the example of FIG. 3, among the three metal layers (24a-24c) of the dissimilar metal layer 24, the first metal layer (24a) and a portion of the second metal layer (24b) protrude from the second surface (10T) of the build-up wiring layer 10. By these metal layers, a protruding portion of each of the first conductor pads 22 and the second conductor pads 23 that protrudes from the second surface (10T) is formed. The remaining portion of the second metal layer (24b) and the third metal layer (24c) are embedded in the first resin insulating layer (11a). That is, the second surface (10T) of the build-up wiring layer 10 is not flush with any interface between the metal layers in the dissimilar metal layer 24. Even when an external force in a surface direction of the second surface (10T) is applied to the protruding portions of the first and second conductor pads (22, 23), a crack or peeling is unlikely to occur in portions of side surfaces of the first and second conductor pads (22, 23) in contact with the second surface (10T).

A height of the protruding portion of each of the first conductor pads 22 relative to the second surface (10T) is substantially equal to a height of the protruding portion of each of the second conductor pads 23 relative to the second surface (10T). Therefore, in FIG. 3, the height of the protruding portion of each of the first conductor pads 22 and the height of the protruding portion of each of the second conductor pads 23 are indicated using the same reference symbol "h." The height (h) of the protruding portion of each of the first conductor pads 22 and the second conductor pads 23 relative to the second surface (10T) is, for example, 2 μm or more and 10 μm or less. When the height (h) is such a length, mounting of the electronic component (E1) (see FIG. 4) to the first conductor pads 22 is likely to be easy. A mounting yield of the electronic component (E1) is thought to be high. Further, a stress caused by a difference between a thermal expansion coefficient of the electronic component and a thermal expansion coefficient of the printed wiring board 100 can be relaxed.

However, it is also possible that the height (h) exceeds or falls below the above-described range. Further, the number of the plating layers that form the protruding portion is also not limited to the above-described example. For example, it is also possible that the first and second conductor pads (22, 23) are each formed by a dissimilar metal layer 24 that is formed such that only the first metal layer (24a) protrudes from the second surface (10T). That is, it is also possible that the second surface (10T) is flush with an interface between the metal layers that form the dissimilar metal layer 24. Even in this case, in the printed wiring board 1 of the embodiment, the dissimilar metal layer 24 is formed by laminating the plating layers. Therefore, the plating layers are firmly bonded to each other and peeling or breaking at an interface between the plating layers is unlikely to occur.

The height (h) of the protruding portion of each of the first conductor pads 22 and the second conductor pads 23 relative to the second surface (10T) can be adjusted by a depth (d) (see FIG. 9A) of recesses (53a) of a metal film 53 for forming the dissimilar metal layers 24. A metal layer portion that forms the protruding portion of each of the first conductor pads 22 and the second conductor pads 23 that protrudes from the second surface (10T), that is, the protruding portion of the dissimilar metal layer 24, is formed in each of the recesses (53a) (see FIG. 9B). Thicknesses of metal layers may be adjusted according to the depth (d) of the recesses (53a). For example, a dissimilar metal layer 24 may be formed in which two or more metal layers are laminated and thicknesses of the metal layers are adjusted such that a desired metal layer is included in the protruding portion of the dissimilar metal layer 24 having the predetermined height (h). In FIG. 3, the dissimilar metal layers 24 of the first conductor pads 22 and the second conductor pads 23, and the metal layers (24a-24c) in each of the dissimilar metal layers 24, are enlarged in the thickness direction of the first conductor pads 22 and the second conductor pads 23 to facilitate understanding of the features.

In the example of FIG. 3, a pitch (P1) between the first conductor pads 22 is smaller than a pitch (P2) between the second conductor pads 23. A semiconductor element or the like in which a terminal pitch is not widened by a rewiring layer such as an interposer can be directly mounted on the first conductor pads 22. Here, the term "pitch" refers to a distance between centers of adjacent conductor pads or the like. As described later, the first conductor pads 22 and the second conductor pads 23 can be positioned according to an electronic component or an external wiring board to be mounted on the printed wiring board 100 of the embodiment.

The number of the first conductor pads 22 and the number of the second conductor pads 23 are not limited to the numbers illustrated in FIG. 3. For example, the first conductor pads 22 in a number corresponding to the number of electrodes of an electronic component to be connected to the first conductor pads 22 can be formed in a layout corresponding to the formation of the electrodes of the electronic component.

Figure 4:
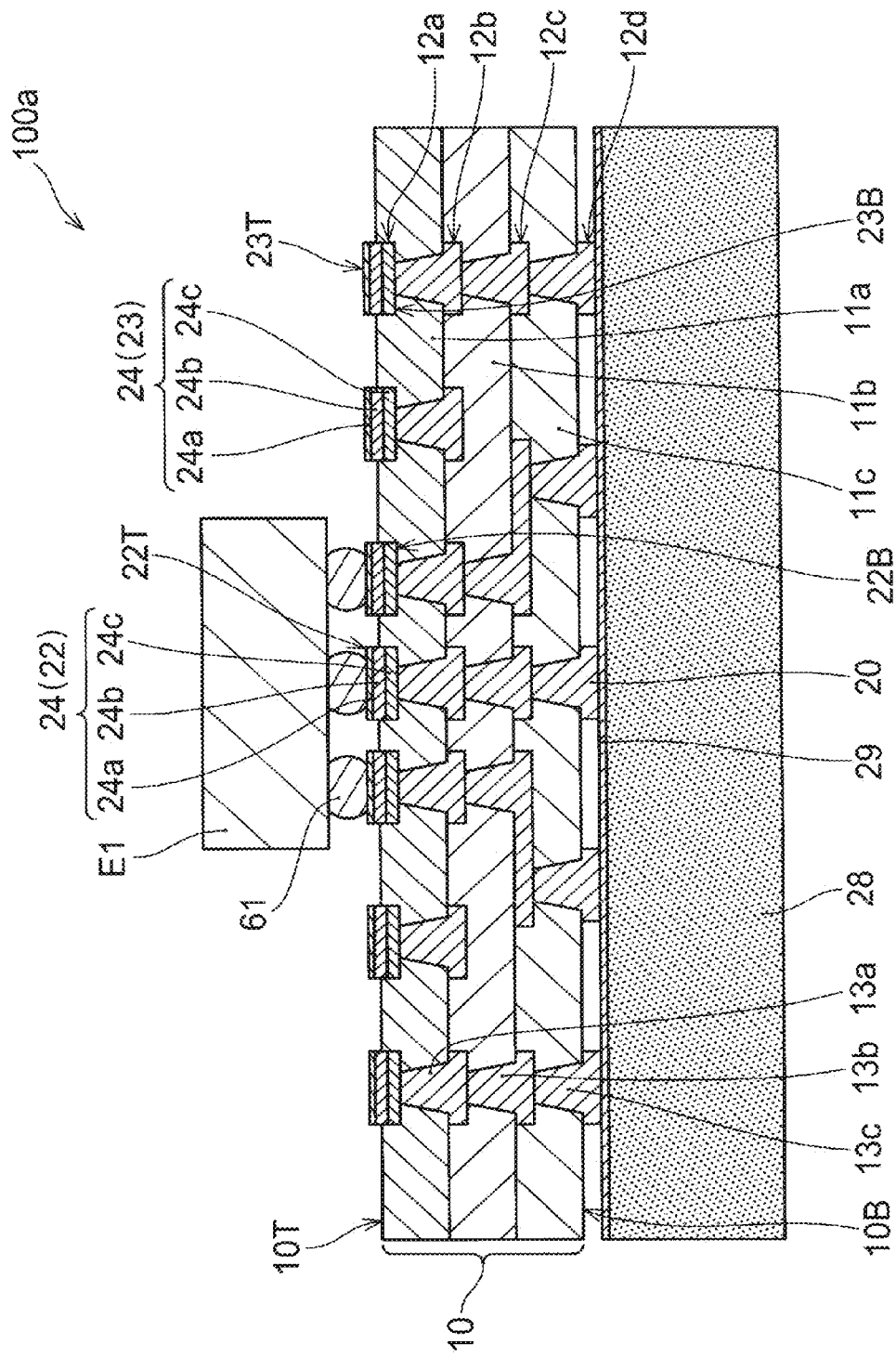
FIG. 4 is a cross-sectional view illustrating a printed wiring board according to another embodiment of the present invention.

FIG. 4 illustrates an example of a printed wiring board (100a) that includes an electronic component (E1) connected to the first conductor pads 22. Similar to the example illustrated in FIG. 2, terminals of the electronic component (E1) are respectively connected to the upper surfaces (22T) of the first conductor pads 22, for example, via bonding members 61 composed of solder or the like. Similar to the example illustrated in FIG. 2, the electronic component (E1) is, for example, a semiconductor element, a passive element or the like. Another electronic component other than the electronic component (E1), or another printed wiring board (not illustrated in the drawings) or the like, for example, can be connected to the second conductor pads 23.

Figure 5:
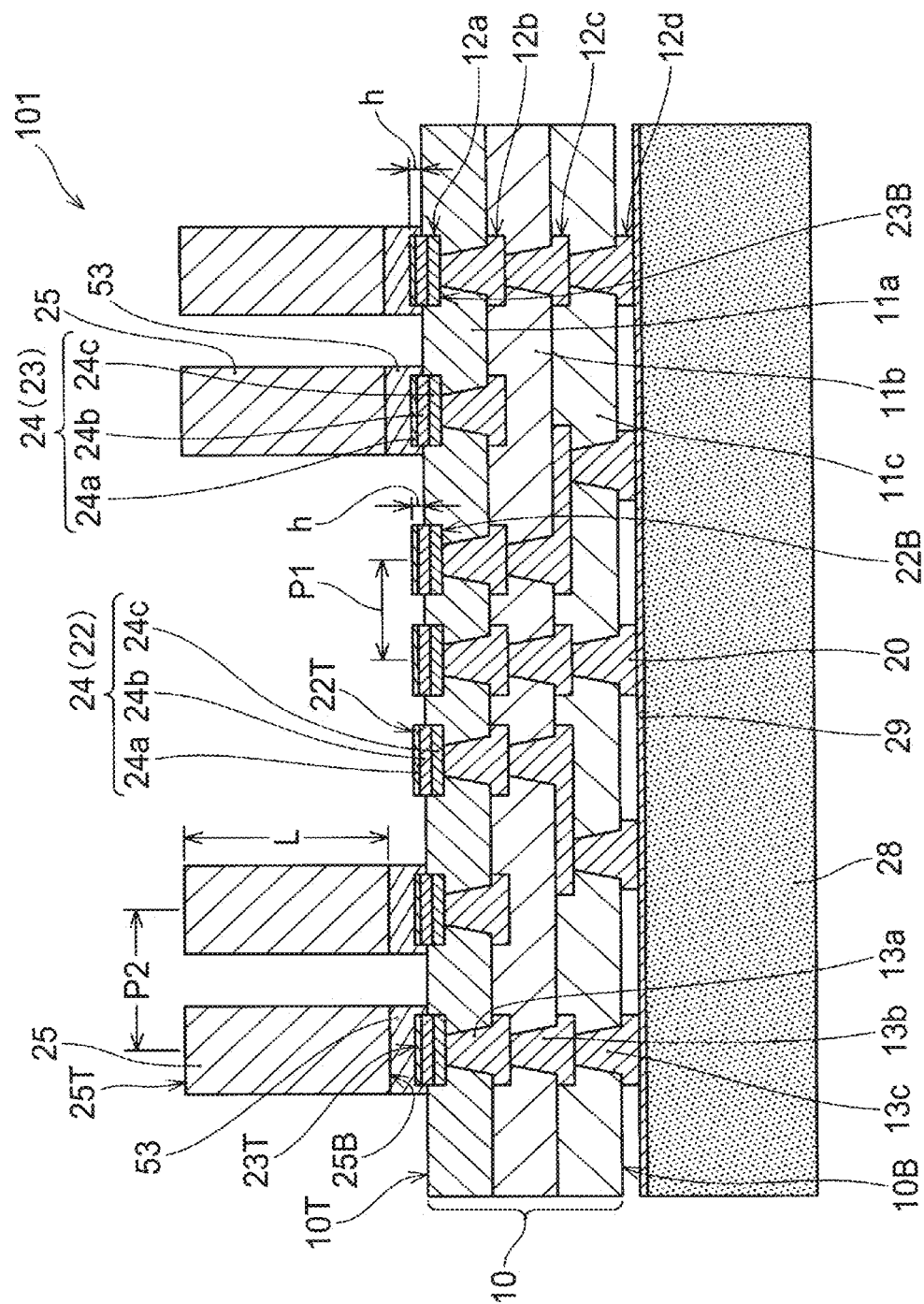
FIG. 5 is a cross-sectional view illustrating a printed wiring board according to another embodiment of the present invention.

As illustrated in FIG. 5, the printed wiring board 100 of the embodiment may further include conductor posts 25 that are formed on the second conductor pads 23. A printed wiring board 101 illustrated in FIG. 5 can be connected, for example, to an external electronic component or another printed wiring board or the like (not illustrated in the drawings) via the conductor posts 25.

According to the embodiment illustrated in FIG. 5, the first conductor pads 22 that connect an electronic component (E2) such as a semiconductor element (see FIG. 6), and the second conductor pads 23 and the conductor posts 25 on the second conductor pads 23 that connect an external electronic component or wiring board (not illustrated in the drawings), are respectively formed by plating. The conductor pads and the conductor posts 25 on the second conductor pads 23 can be precisely formed with very narrow widths and intervals. Therefore, even when the intervals and widths of the first conductor pads 22 and the second conductor pads 23 are narrowed in order to achieve fine pitches, contact incidents between adjacent conductor pads or conductor posts 25 can be prevented. Reliability of the printed wiring board 101 is improved. Fine pitches in the printed wiring board 101 can be achieved. A package-on-package having a high degree of integration and highly reliable internal connection parts can be provided.

In the example of FIG. 5, the conductor posts 25 are respectively formed by electrolytic plating on the second conductor pads 23 via the metal films 53. The conductor posts 25 respectively have end surfaces (25B) that are respectively bonded to the metal films 53 on the second conductor pads 23 side and end surfaces (25T) on the opposite side of the second conductor pads 23 side. An external wiring board or the like is mounted on the end surfaces (25T) of the conductor posts 25. In the example of FIG. 5, straight lines that respectively pass through centers of the upper surfaces (23T) of the second conductor pads 23 and are perpendicular to the upper surfaces (23T) respectively pass through centers of the end surfaces (25B, 25T) of the conductor posts 25. The conductor posts 25 are formed such that the conductor posts 25 are respectively positioned at substantially centers of the second conductor pads 23. Therefore, a pitch between the conductor posts 25 is equal to the pitch (P2) between the second conductor pads 23.

The conductor posts 25 can each be preferably formed from a plating film of the same material as the respective metal film 53 using the metal film 53 as a seed layer. The plating film is, for example, a copper plating film. In the printed wiring board 101 of the embodiment, the conductor posts 25 are respectively directly bonded to the metal films 53. Since the conductor posts 25 and the metal films 53 are firmly bonded to each other, even when a stress occurs during a manufacturing process or use of the printed wiring board 101, peeling or breaking is unlikely to occur at interfaces between the conductor posts 25 and the metal films 53. Since the same material can be used for the conductor posts 25 and the metal films 53, a thermal stress is less likely to occur at interface portions. Further, the metal films 53 respectively cover the upper surfaces (23T) of the second conductor pads 23 and side surfaces of the protruding portions of the second conductor pads 23 that protrude from the second surface (10T). That is, not only the upper surface (23T) but also the side surfaces of the protruding portions of the second conductor pads 23 are bonded to the metal films 53. Peeling or the like of the metal films 53 is unlikely to occur. Since the conductor posts 25 and the second conductor pads 23 are firmly connected to each other via the metal films 53, reliability of the printed wiring board is improved.

The conductor posts 25 each have a diameter of, for example, 50 μm or more and 150 μm or less. In the example of FIG. 5, the diameter of the end surface (25T) of each of the conductor posts 25 is larger than a diameter of the upper surface (23T) of each of the second conductor pads 23. The term "diameter" is used for convenience. However, a planar shape of each of the conductor pads or the conductor posts is not limited to a circle or an ellipse. The conductor pads or the conductor posts can each have any planar shape. Therefore, the term "diameter" of the end surface (25T) of each of the conductor posts 25 or the like refers to a maximum value among distances between two points on an outer circumference of the end surface (25T) or the like.

The conductor posts 25 each have a length (L). The length (L) is, for example, 50 μm or more and 200 μm or less. However, the length (L) of the conductor posts 25 is not limited to this range. For example, the conductor posts 25 can be formed to each have any length according to a thickness of an electronic component to be connected to the first conductor pads 22 of the printed wiring board 101 of the embodiment.

Figure 6:
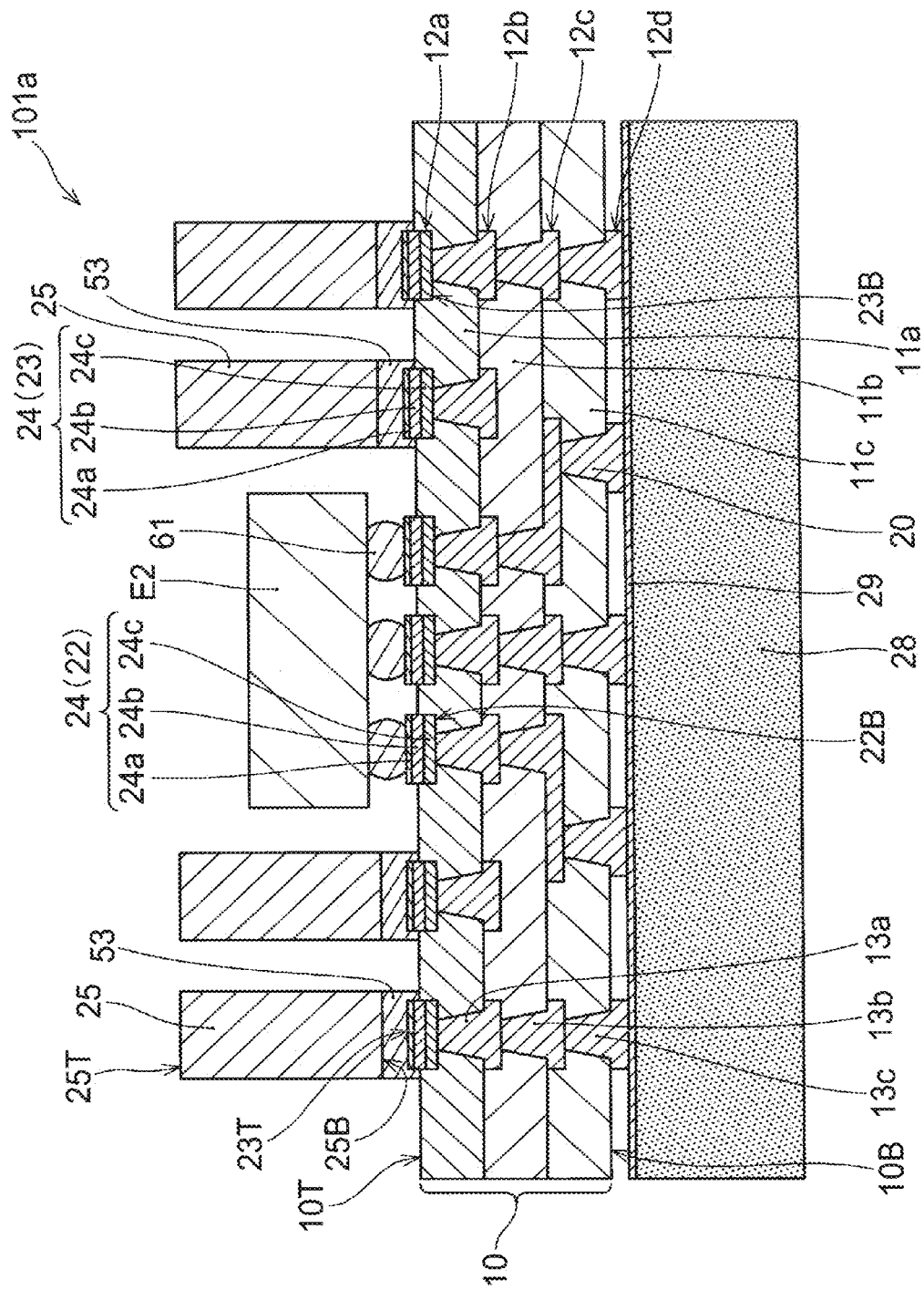
FIG. 6 is a cross-sectional view illustrating a printed wiring board according to another embodiment of the present invention.

FIG. 6 illustrates an example of a printed wiring board (101a) that includes an electronic component (E2) connected to the first conductor pads 22. Similar to the examples illustrated in FIGS. 2 and 4, terminals of the electronic component (E2) are respectively connected to the first conductor pads 22, for example, via bonding members 61 composed of solder or the like. As described above, since the conductor posts 25 each have the predetermined length (L) (see FIG. 5), the relatively thick external electronic component (E2) can be mounted on the printed wiring board (101a). Further, for example, a large external electronic component or the like (not illustrated in the drawings) having terminals only at an outer peripheral portion may be mounted on the end surfaces (25T) of the conductor posts 25 in a manner straddling over the electronic component (E2) connected to the first conductor pads 22. That is, multiple electronic components can be mounted in a manner overlapping in the thickness direction of the printed board (101a).

High density mounting becomes possible. Due to the conductor posts 25, a stress caused by a difference between a thermal expansion coefficient of an external electronic component or wiring board and a thermal expansion coefficient of the printed wiring board (101a) is relaxed. Even when the printed wiring board in a package-on-package is subjected to heat cycles, connection between an external electronic component or the like and the printed wiring board (101a) can be stable for a long period of time. Examples of the external electronic component (E2) connected to the first conductor pads 22 include a bare chip of a semiconductor element, and a relatively small integrated circuit device such as a WLP or a CSP. Examples of an external electronic component connected to the conductor posts 25 include a BGA, a relatively large integrated circuit device that is packaged together with a wiring board for rewiring, and the like. The external electronic component (E2) and the external electronic component connected to the conductor posts 25 may be semiconductor components or passive components other than those described above.

Next, an embodiment of a method for manufacturing the printed wiring board illustrated in FIG. 1 is described with reference to FIGS. 7A-7L.

Figure 7A:
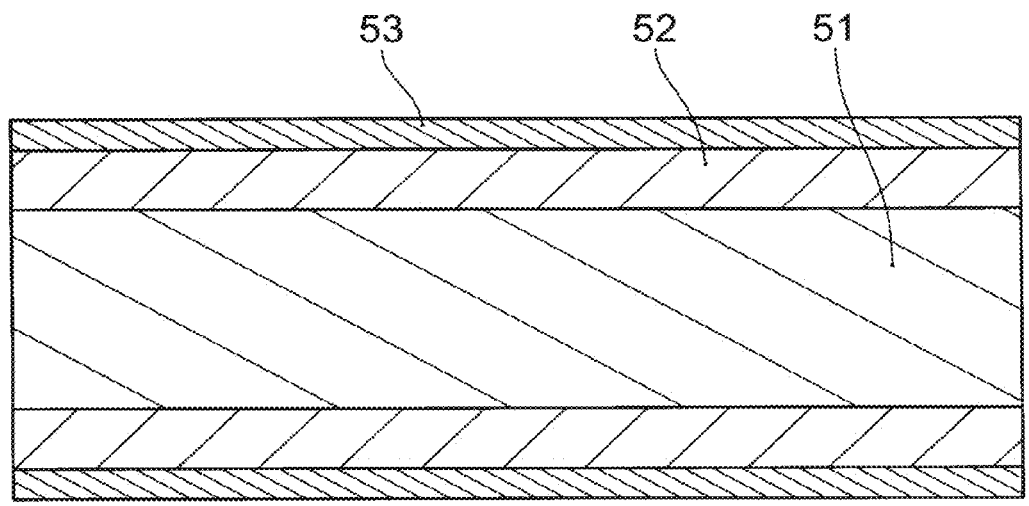
FIG. 7A-7L illustrate a method for manufacturing a printed wiring board according to another embodiment of the present invention.

As illustrated in FIG. 7A, for example, a base plate 51 and a metal film 53 with a carrier copper foil 52 are prepared. The base plate 51 is only conveniently drawn. In FIG. 7A and later-described FIGS. 7B-7K, and in FIGS. 7A-7J, it is not intended to illustrate an actual thickness of the base plate 51. Further, similar to FIG. 6, the metal film 53 is also enlarged in the thickness direction. The carrier copper foil 52 of the carrier copper foil-attached metal film and the metal film 53 are bonded to each other, for example, by a thermoplastic adhesive (not illustrated in the drawings). The carrier copper foil 52 of the carrier copper foil-attached metal film, for example, is affixed to the base plate 51 composed of a prepreg by thermal compression bonding. By bonding the carrier copper foil 52 and the metal film 53 to each other with a thermoplastic adhesive, the metal film 53 and the carrier copper foil 52 can be easily separated from each other by raising temperature and peeling the metal film 53 and the carrier copper foil 52 away from each other in a later process. The carrier copper foil 52 and the metal film 53 may also be bonded to each other only in a margin portion near an outer periphery. The base plate 51 has an appropriate rigidity. For example, the base plate 51 may be a metal plate of copper or the like, or may be an insulating plate of ceramics or the like. As the metal film 53, for example, a copper foil is used. However, the material of the metal film 53 is not limited to this. The metal film 53 may be formed of a material that allows the first conductor layer (12a) (see FIG. 7D) to be formed on a surface thereof. For example, the metal film 53 may be a film-like or foil-like body composed of another metal such as nickel.

FIG. 7A-7I illustrate an example of a manufacturing method of the embodiment in which the first conductor layer (12a) and the like are formed on both sides of the base plate 51. However, in FIG. 7B-7I, only one side of the base plate 51 is illustrated and the other side is omitted. In such an example of the manufacturing method, two sets of the first conductor layer (12a) and the like are simultaneously formed. However, it is also possible that the first conductor layer (12a) and the like are formed on only one side of the base plate 51. In the following description, the manufacturing method of the embodiment is described with respect to one side of the base plate 51, and illustration and description about reference numeral symbols in the drawings with respect to the other side are omitted as appropriate.

Figure 7B:
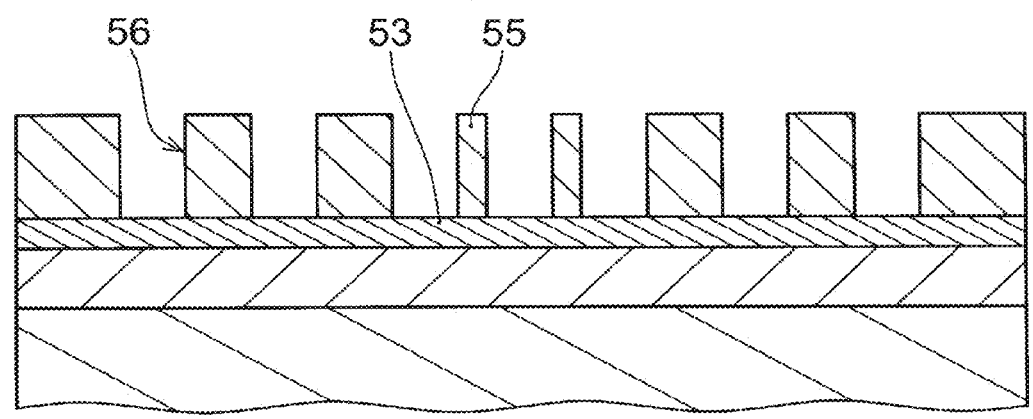
Figure 7C:
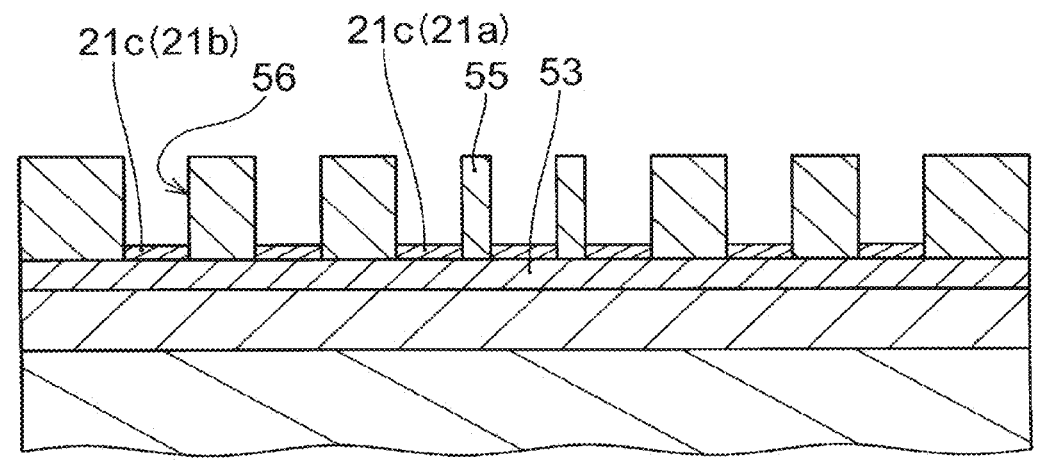

As illustrated in FIG. 7B, a resist pattern 55 is formed on the metal film 53, the resist pattern 55 having openings 56 at positions where the first and second conductor pads (21a, 21b) (see FIG. 7C) of the first conductor layer (12a) are respectively formed. The metal film 53 is exposed from bottom surfaces of the openings 56.

Next, plating layers (21c) are respectively formed in the openings 56 by electrolytic plating using the metal film 53 as a seed layer. That is, the multiple first conductor pads (21a) and the multiple second conductor pads (21b) are formed. When the first and second conductor pads (21a, 21b) are formed that respectively include corrosion resistant plating layers as surfaces of the first and second conductor pads (21a, 21b) that are exposed from the second surface (10T), first plating layers composed of gold, for example, are respectively formed as the corrosion resistant plating layers on the bottom surfaces of the openings 56. Next, second plating layers are respectively formed on the first plating layers. The first and second conductor pads (21a, 21b) are each formed by a multilayer body that includes a first plating layer and a second plating layer. The corrosion resistant plating layers of the first and second conductor pads (21a, 21b) facing the metal film 53 are exposed by a removal process of the metal film 53 to be described later (see FIG. 7L).

Figure 7D:
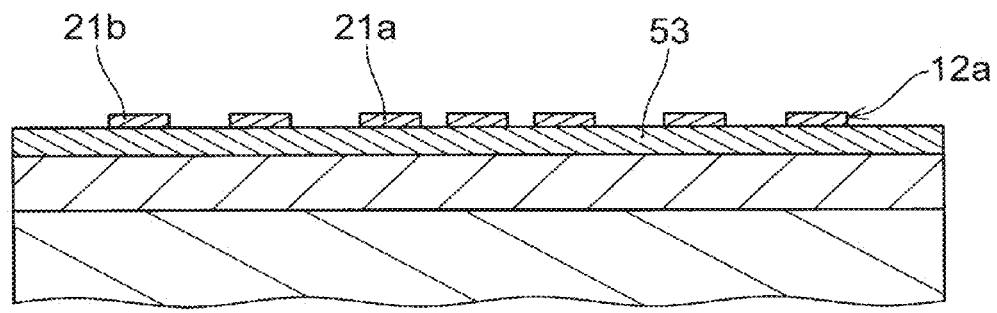

Next, by removing the resist pattern 55, as illustrated in FIG. 7D, the first conductor layer (12a) is formed with a predetermined pattern including the first and second conductor pads (21a, 21b) on a surface of the metal film 53 on the opposite side of the carrier copper foil 52.

Figure 7E:
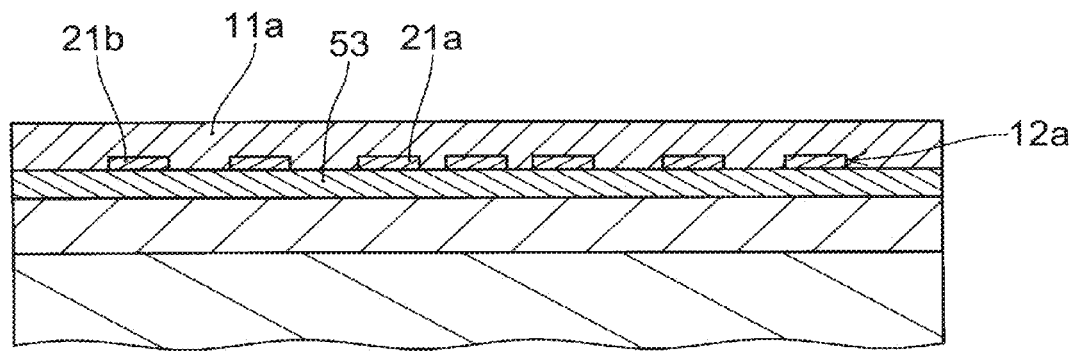

Next, as illustrated in FIG. 7E, the first resin insulating layer (11a) covering the first conductor layer (12a) is formed on the metal film 53. The first resin insulating layer (11a) is formed so as to cover exposed surfaces of the first and second conductor pads (21a, 21b) in the first conductor layer (12a). That is, in the example of FIG. 7E, side surfaces and upper surfaces (surfaces of the first and second conductor pads (21a, 21b) on the opposite side of the metal film 53) of the first and second conductor pads (21a, 21b) are covered by the first resin insulating layer (11a). For example, a film-like insulating material is laminated on the first conductor layer (12a) and is pressed and heated. An example of the material of the first resin insulating layer (11a) is an epoxy resin that does not contain a reinforcing material. However, the material of the first resin insulating layer (11a) may also be a material obtained by impregnating a reinforcing material such as glass fiber with epoxy or other resin compositions. A resin composition such as epoxy may contain an inorganic filler such as silica in an amount of 30 mass % or more and 80 mass % or less.

Figure 7F:
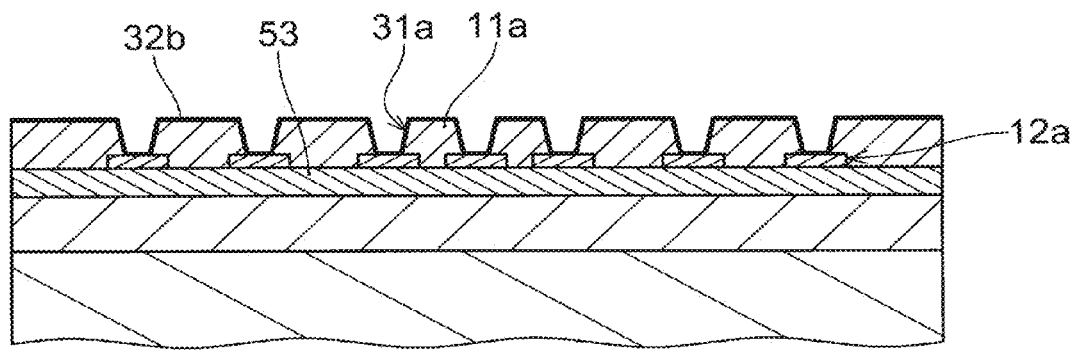

Next, as illustrated in FIG. 7F, conduction holes (31a) that penetrate the first resin insulating layer (11a) are formed. The conduction holes (31a) are preferably formed by irradiating $CO_2$ laser beams to formation locations of the conduction holes (31a) of the first resin insulating layer (11a). When laser beams are irradiated from a surface of the first resin insulating layer (11a) on the opposite side of the first conductor layer (12a) side, the conduction holes (31a) are formed each having a tapered shape that is gradually reduced in diameter toward the first conductor layer (12a) side.

As illustrated in FIG. 7F, a metal layer (32b) is formed in the conduction holes (31a) and on the surface of the first resin insulating layer (11a), for example, by chemical plating (electroless plating). The metal layer (32b) may also be formed by sputtering, vacuum deposition, or the like. A material of the metal layer (32b) is also preferably copper, but it is not limited to copper. For example, the metal layer (32b) may be a Ti/Cr sputtered layer formed by sputtering. The metal layer (32b) has a thickness of about 0.05 μm or more and 1.0 μm or less.

Figure 7G:
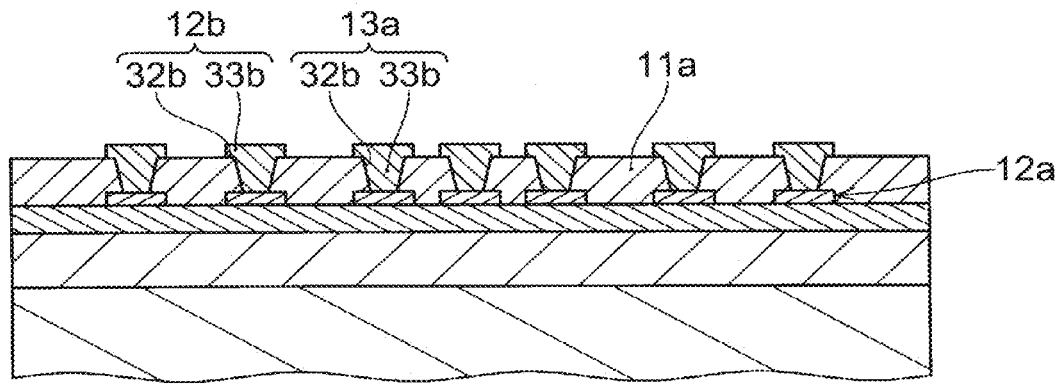

Thereafter, as illustrated in FIG. 7G, an electrolytic plating film (33b) is formed, for example, by electrolytic plating using the metal layer (32b) as a seed layer. The second conductor layer (12b) is formed by the metal layer (32b) and the electrolytic plating film (33b) on the first resin insulating layer (11a). Further, the first via conductors (13a) are formed by the metal layer (32b) and the electrolytic plating film (33b) in the conduction holes (31a). A conductor pattern (wiring pattern) of the second conductor layer (12b) can be obtained by forming a plating resist layer (not illustrated in the drawings) having openings at predetermined positions and forming the electrolytic plating film (33b) in the openings. The openings of the plating resist layer are provided at formation positions of the conductor pattern of the second conductor layer (12b) and on the conduction holes (31a). After the formation of the electrolytic plating film (33b), the plating resist layer (not illustrated in the drawings) is removed. The metal layer (32b) exposed by the removal of the plating resist layer is removed by etching. As a result, the second conductor layer (12b) as illustrated in FIG. 7G is formed. Thereafter, the metal layer (32b) and the electrolytic plating film (33b) are not distinguished from each other and are collectively referred to as the second conductor layer (12b). Materials of the metal layer (32b) and the electrolytic plating film (33b) are not particularly limited. For example, nickel or a composite layer of gold-nickel or gold-nickel-copper, or the like may be used. Preferably, copper is used. The second conductor layer (12b) can be inexpensively and easily formed.

Figure 7H:
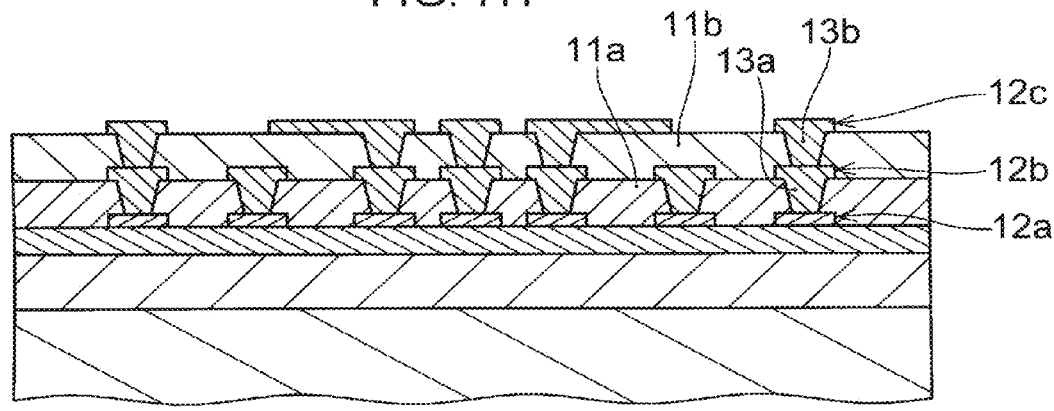

Next, as illustrated in FIG. 7H, on the second conductor layer (12b) and the first resin insulating layer (11a), by repeating processes similar to the processes of FIG. 7E-7G, the third conductor layer (12c) and the second resin insulating layer (11b) are formed. Similar to the above-described FIG. 7F-7G, the third conductor layer (12c) and the second conductor layer (12b) are connected to each other by forming the second via conductors (13b).

Figure 7I:
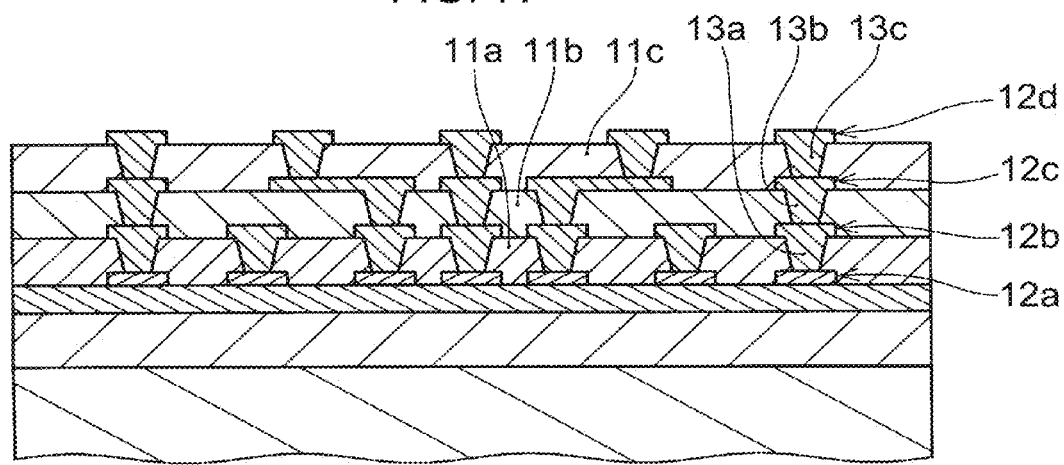

Further, by repeating processes similar to the processes of the FIG. 7E-7G, as illustrated in FIG. 7I, on the third conductor layer (12c) and the second resin insulating layer (11b), the fourth conductor layer (12d) and the third resin insulating layer (11c) are formed. Then, similar to the above-described FIG. 7F-7G, the fourth conductor layer (12d) and the third conductor layer (12c) are connected to each other by forming the third via conductors (13c).

FIG. 1 illustrates the build-up wiring layer 10 having a four-layer structure in which the conductor layers (each having a predetermined wiring pattern) and the resin insulating layers are laminated. By repeating the processes of FIG. 7E-7G, the build-up wiring layer 10 can be formed having a larger desired number of layers. Further, it is also possible that the build-up wiring layer 10 has only one resin insulating layer and conductor layers provided on both sides of the resin insulating layer.

Figure 7J:
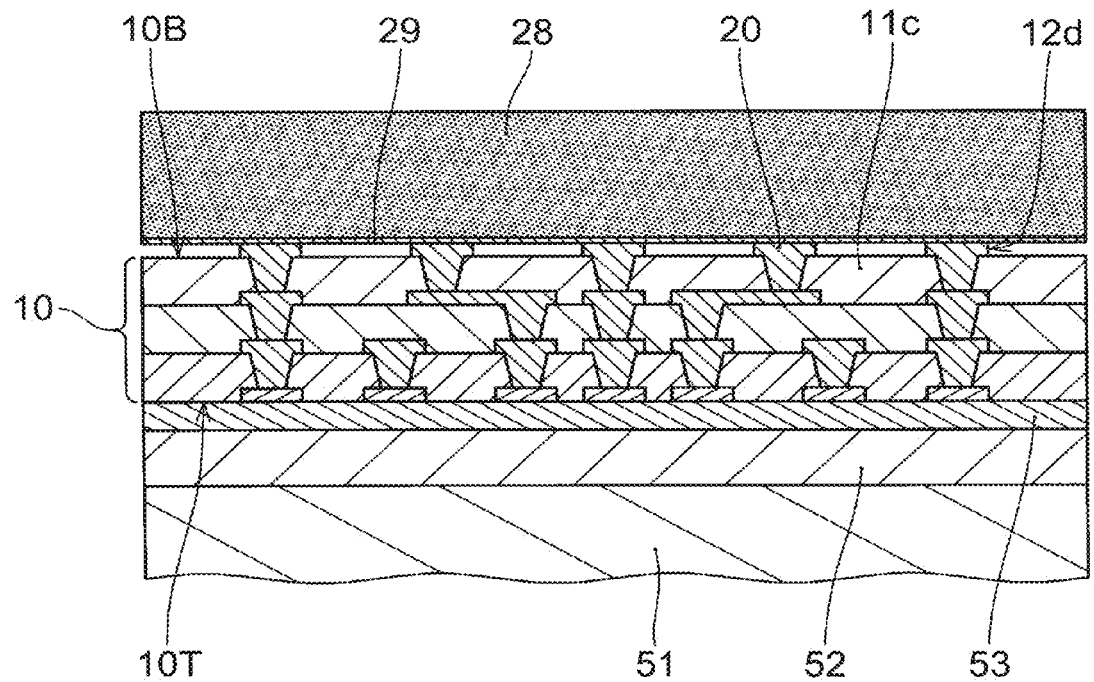

Next, as illustrated in FIG. 7J, the support plate 28 is provided on the first surface (10B) side of the build-up wiring layer 10. The support plate 28 is affixed to the fourth conductor layer (12d) including the third conductor pads 20 on the third resin insulating layer (11c) by the adhesive 29. The support plate 28 supports the printed wiring board after a removal process (to be described later) of the base plate 51 and the carrier copper foil 52. For example, the support plate 28 can function as a support member of the build-up wiring layer 10 during subsequent processes (to be described later) of the printed wiring board 1 and during mounting of an electronic component on the first and second conductor pads (21a, 21b) (see FIG. 1). As the support plate 28, a glass epoxy substrate obtained by curing a prepreg, or a metal plate similar to the base plate 51 (see FIG. 7A), or a double-sided copper clad laminated plate or the like, can be used. The support plate 28 is bonded to the build-up wiring layer 10 via the adhesive 29 that has an adhesion property with respect to the fourth conductor layer (12d). A material that forms the adhesive 29 is not particularly limited as long as the material can be bonded to the support plate 28. The support plate 28 may be removed from the build-up wiring layer 10 such as after the above-described mounting of the electronic component. Therefore, as the material of the adhesive 29, in particular, a material that has moderate adhesiveness but does not develop a strong adhesive force with respect to a bonding surface of the fourth conductor layer (12d) is preferred. It is also possible that the adhesive 29 loses adhesiveness with respect to the fourth conductor layer (12d) by a specific treatment such as ultraviolet irradiation or heating. For example, an acrylic resin can be used as the material of the adhesive 29.

Figure 7K:
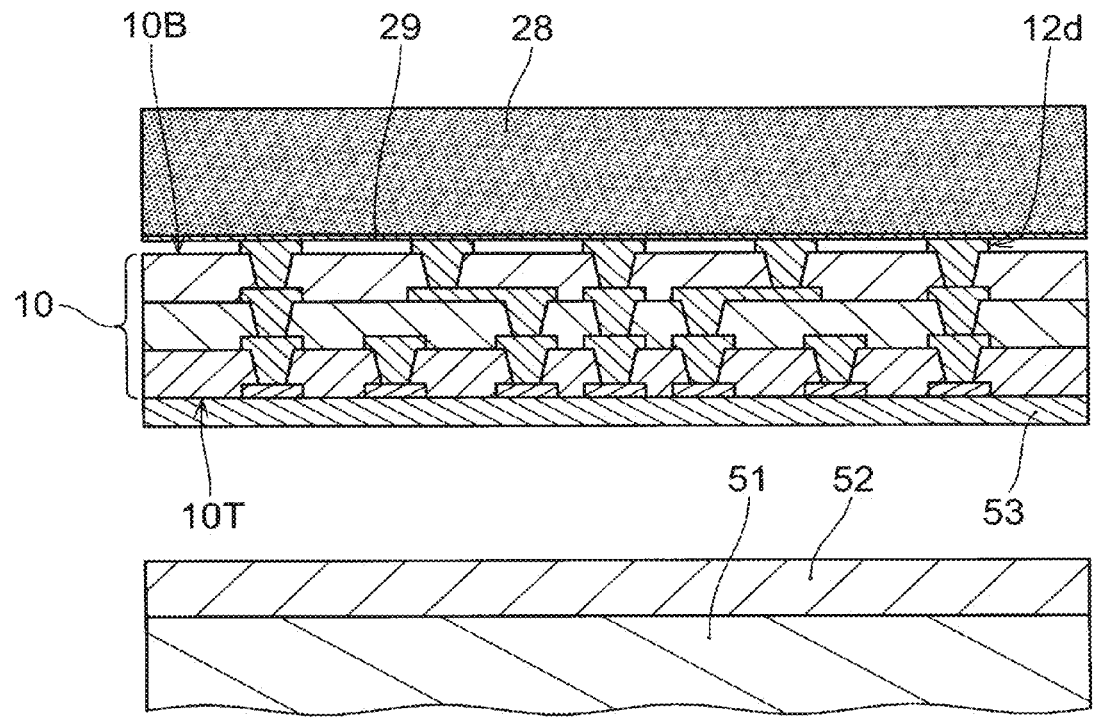

Next, as illustrated in FIG. 7K, the base plate 51 and the carrier copper foil 52 are removed. By removing the base plate 51 and the carrier copper foil 52, two build-up wiring layers 10 are obtained. As described above, the carrier copper foil 52 and the metal film 53 are bonded to each other by a thermoplastic resin or the like. Therefore, for example, by raising temperature and applying a force, the base plate 51 and the carrier copper foil 52 can be easily separated from the metal film 53. As a result, a bonding surface of the metal film 53 to the carrier copper foil 52 is exposed. When the carrier copper foil 52 and the metal film 53 are bonded to each other only in a peripheral margin portion, the two can be easily separated by cutting an inner side of the bonded portion. The metal film 53 is exposed on the entire surface on the second surface (10T) side of the build-up wiring layer 10.

Figure 7L:
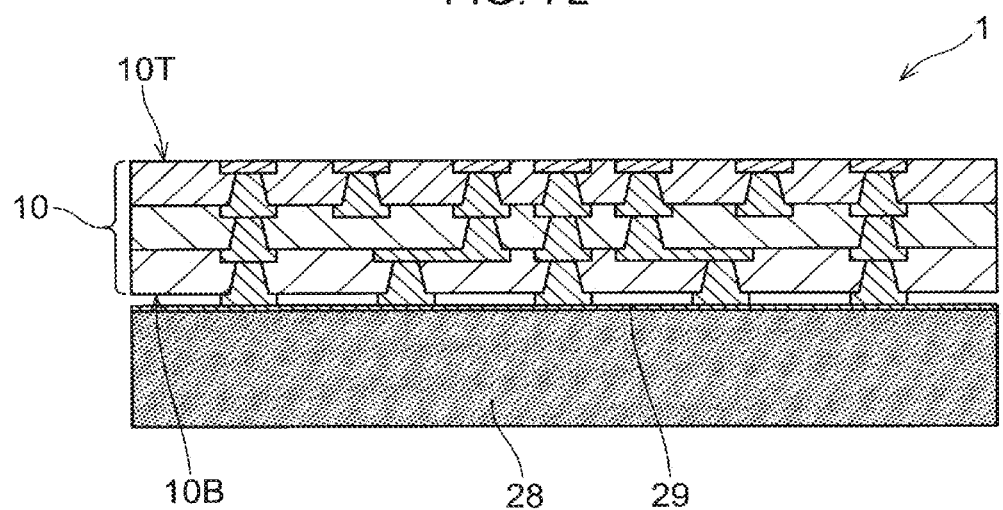

Next, as illustrated in FIG. 7L, the metal film 53 is removed by etching. By the removal of the metal film 53, the surfaces of the first and second conductor pads (21a, 21b) on the opposite side of the support plate 28 are exposed. That is, the surfaces of the first and second conductor pads (21a, 21b) on the opposite side of the first surface (10B) of the build-up wiring layer 10 are exposed. The printed wiring board 1 illustrated in FIG. 1 is completed. In the printed wiring board 1 of the embodiment, the multiple conductor pads (first and second conductor pads (21a, 21b)) including pads for connecting to an electronic component are formed at fine pitches on the second surface (10T) of the build-up wiring layer 10. The second surface (10T) can be a preferred mounting surface for connecting an electronic component such as a semiconductor element in which a large number of electrodes are provided at a fine pitch.

Figure 8A:
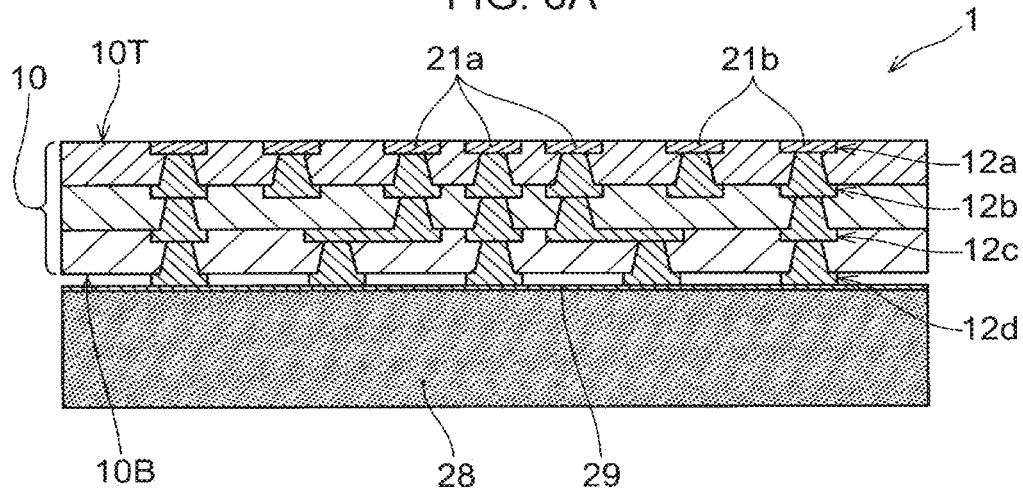
FIG. 8A-8D illustrate a method for manufacturing a printed wiring board according to another embodiment of the present invention.
Figure 8B:
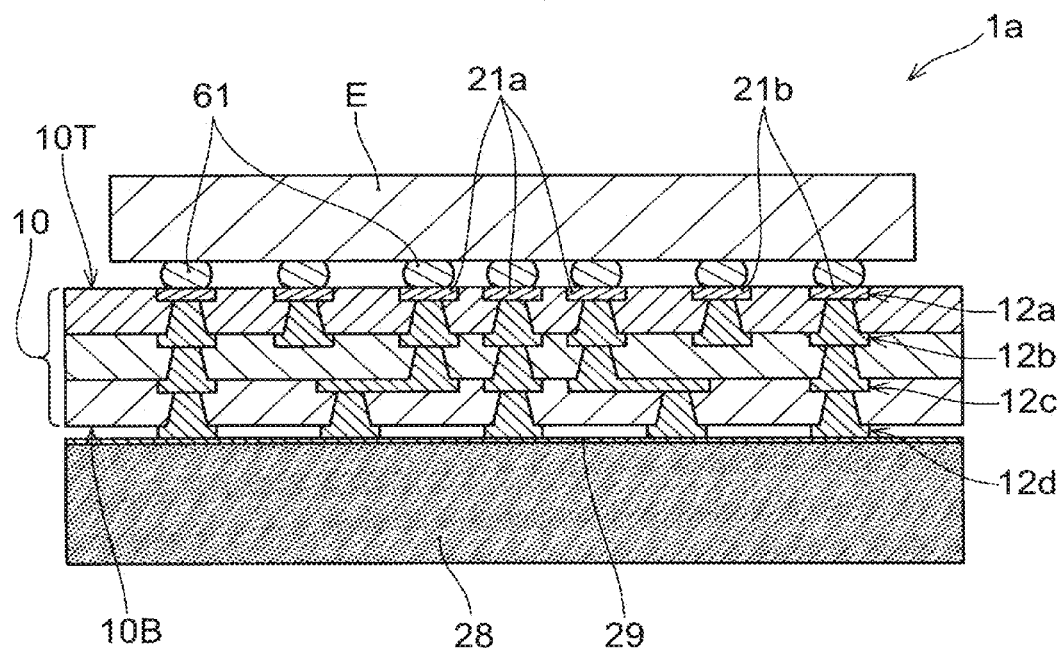

On the completed printed wiring board 1 (see FIG. 8A), an external electronic component (E) can be mounted. For example, a bonding material such as a solder paste is applied on the first conductor pads (21a) and on the second conductor pads (21b) using a mask or the like. Then, as illustrated in FIG. 8B, the electronic component (E) is positioned on the first and second conductor pads (21a, 21b). Thereafter, by applying heat by solder reflow or the like, the first and second conductor pads (21a, 21b) and the electronic component (E) are bonded to each other by the bonding members 61. A metallic material other than solder or a conductive adhesive may also be used for the bonding members 61. The printed wiring board (1a) of another example of the embodiment illustrated in FIG. 2 is completed.

Figure 8C:
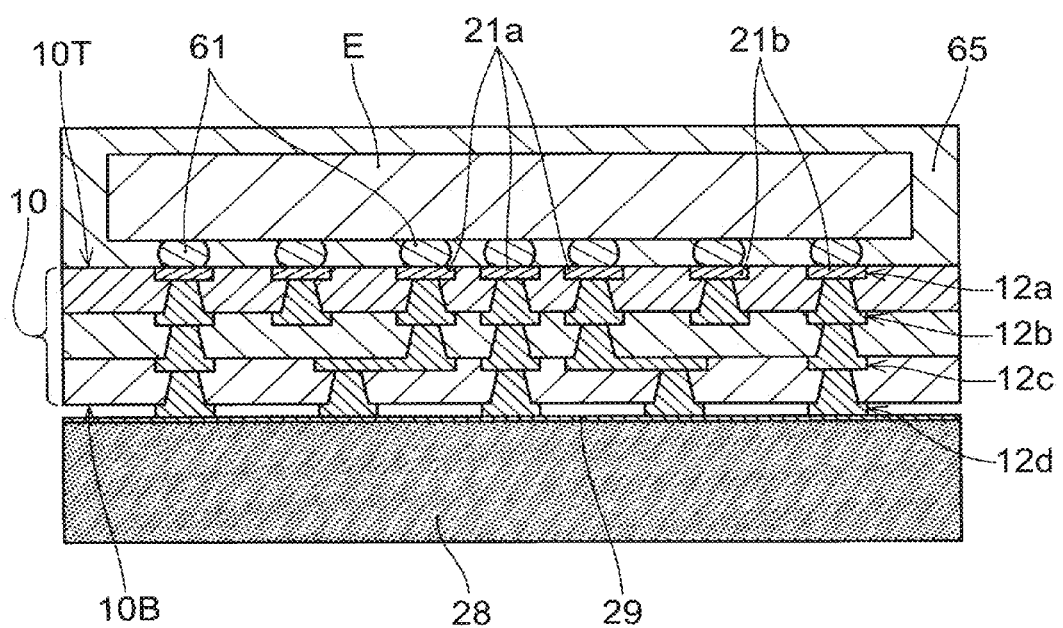

As illustrated in FIG. 8C, after the mounting of the electronic component (E), the mounted electronic component (E) and the bonding members 61 on the second surface (10T) of the build-up wiring layer 10 may be sealed using a resin sealing layer 65. The electronic component (E) can be protected from an external stress. Further, possible stress acting on the bonding members 61 due to ambient temperature variation can be reduced. Connection reliability of the electronic component (E) can be improved. In the example of FIG. 8C, the resin sealing layer 65 is formed around the entire electronic component (E) including a gap between the electronic component (E) and the build-up wiring layer 10. For example, the resin sealing layer 65 can be formed by supplying a flowable molding resin to an upper surface and surroundings of the electronic component (E) and applying heat to cure the molding resin when necessary. It is not necessarily required to form the resin sealing layer 65.

Figure 8D:
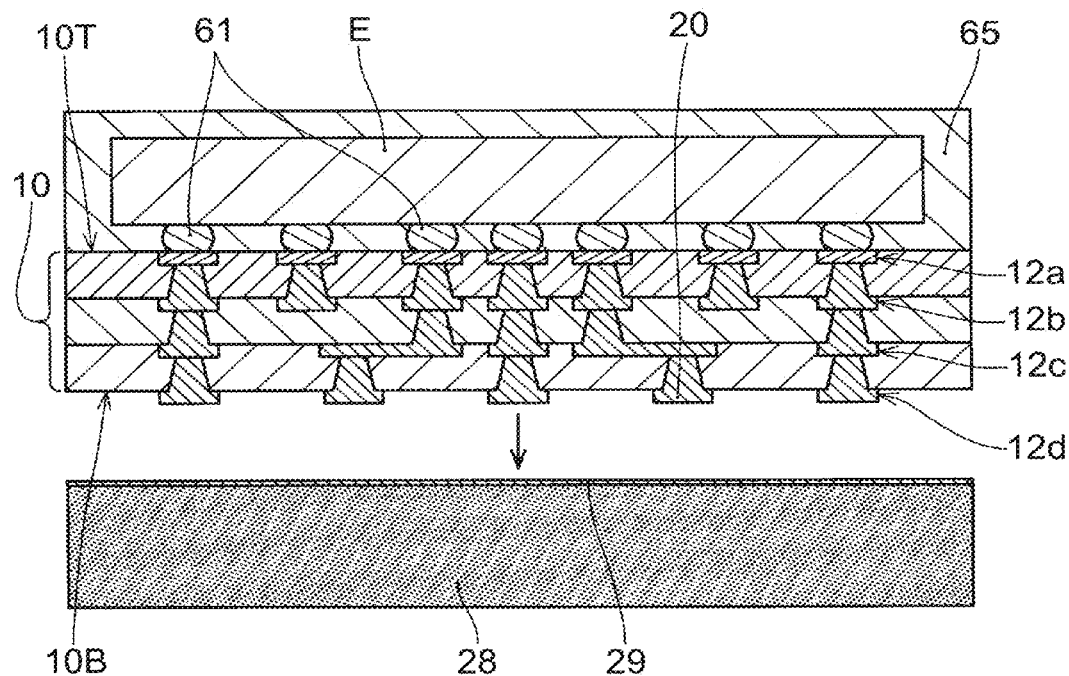

The support plate 28 can be removed from the build-up wiring layer 10, such as when the printed wiring board (1*a*) is in use. This example is illustrated in FIG. 8D. As described above, since the adhesive 29 does not develop a strong adhesive force with respect to the bonding surface of the fourth conductor layer (12*d*), the support plate 28 can be easily removed when necessary. The third conductor pads 20 are exposed on the first surface (10B) of the build-up wiring layer 10. The third conductor pads 20 can be connected to an external electrical circuit (not illustrated in the drawings). When the resin sealing layer 65 is not formed, the support plate 28 can be removed at an appropriate timing after the mounting of the electronic component (E) and until, for example, a connection process between the third conductor pads 20 and the external electrical circuit is performed.

In the printed wiring board 1 illustrated in FIGS. 1 and 2, the exposed surface sides of the first and second conductor pads (21*a*, 21*b*) on the opposite side of the support plate 28 are formed in a state flush with the second surface (10T) of the build-up wiring layer 10. However, although not illustrated in the drawings, it is also possible that the exposed surfaces of the first and second conductor pads (21*a*, 21*b*) on the opposite side of the support plate 28 are formed so as to be recessed from the second surface (10T) of the build-up wiring layer 10. That is, during the etching of the metal film 53 (see FIG. 7K), even when the metal film 53 is substantially removed and the second surface (10T) of the build-up wiring layer 10 below the metal film 53 is exposed, the etching process may be continued. The exposed surfaces of the first and second conductor pads (21*a*, 21*b*) are etched and become recessed relative to the second surface (10T). When the electronic component (E) (see FIG. 2) or the like is connected, portions of the first resin insulating layer (11*a*) between the conductor pads become walls so that the bonding members 61 composed of solder or the like can be formed without wet-spreading to side surfaces of the first and second conductor pads (21*a*, 21*b*) or the like. An electrical short circuit state due to contact between bonding members 61 of adjacent conductor pads can be prevented. After the removal of the metal film 53, how far the exposed surfaces of the first and second conductor pads (21*a*, 21*b*) are etched is arbitrary. For example, the exposed surfaces of the first and second conductor pads (21*a*, 21*b*) can be recessed by a few micrometers from the second surface (10T).

The method for manufacturing the printed wiring board of the embodiment is not limited to the method described with reference to FIGS. 7A-7L and FIG. 8A-8D. The conditions, the processing order and the like of the method may be arbitrarily modified. Further, it is also possible that a specific process is omitted or another process is added.

Further, although not illustrated in FIG. 1, it is also possible that a solder resist layer is formed on the second surface (10T) of the build-up wiring layer 10. Further, it is also possible that a protective film composed of Ni/Au, Ni/Pd/Au, Sn or the like is formed on the exposed surface of each of the first and second conductor pads (21*a*, 21*b*).

Next, an embodiment of a method for manufacturing the printed wiring board 100 illustrated in FIG. 3 is described with reference to FIG. 9A-9K.

Figure 9A:
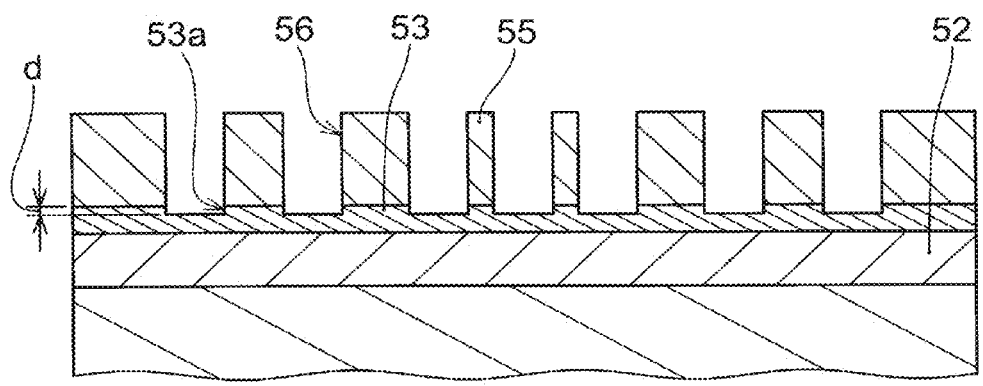

On the base plate 51 and the metal film 53 with the carrier copper foil 52 that are prepared in the same way as in the process of FIG. 7A, a resist pattern 55 is formed on the metal film 53 in the same way as in the process of FIG. 7B, the resist pattern 55 having openings 56 at positions where the first conductor pads 22 and the second conductor pads 23 of the first conductor layer (12*a*) are respectively formed. The metal film 53 is exposed in the openings 56. Next, as illustrated in FIG. 9A, the metal film 53 exposed by the openings 56 is etched. Multiple recesses (53*a*) are formed in the metal film 53.

The recesses (53*a*) each have a depth (d). The depth (d) is a length from an interface between the metal film 53 and the resist pattern 55 to a bottom surface of each of the recesses (53*a*). The depth (d) of the recesses (53*a*) is, for example, 2 μm or more and 10 μm or less. The depth (d) of the recesses (53*a*) substantially corresponds to the height (h) (see FIGS. 3 and 5) of the protruding portion of the dissimilar metal layer 24 relative to the second surface (10T). Therefore, by varying the depth (d) of the recesses (53*a*), that is, an etching amount of the metal film 53 in the present process, the height (h) of the protruding portion of the dissimilar metal layer 24, that is, the protruding portion of each of the first conductor pads 22 and the second conductor pads 23, relative to the second surface (10T) can be easily adjusted. The height (h) of the protrusion of each of the first conductor pads 22 and the second conductor pads 23 relative to the second surface (10T) can be arbitrarily selected according to a thickness or the like of an electronic component to be mounted on the first conductor pads 22. As illustrated in FIG. 9A, the depth (d) of the recesses (53*a*) is smaller than a thickness of the metal film 53. That is, the recesses (53*a*) do not penetrate the metal film 53. Further, the recesses (53*a*) are formed to have substantially the same planar shape as the first conductor pads 22 and the second conductor pads 23.

Figure 9B:
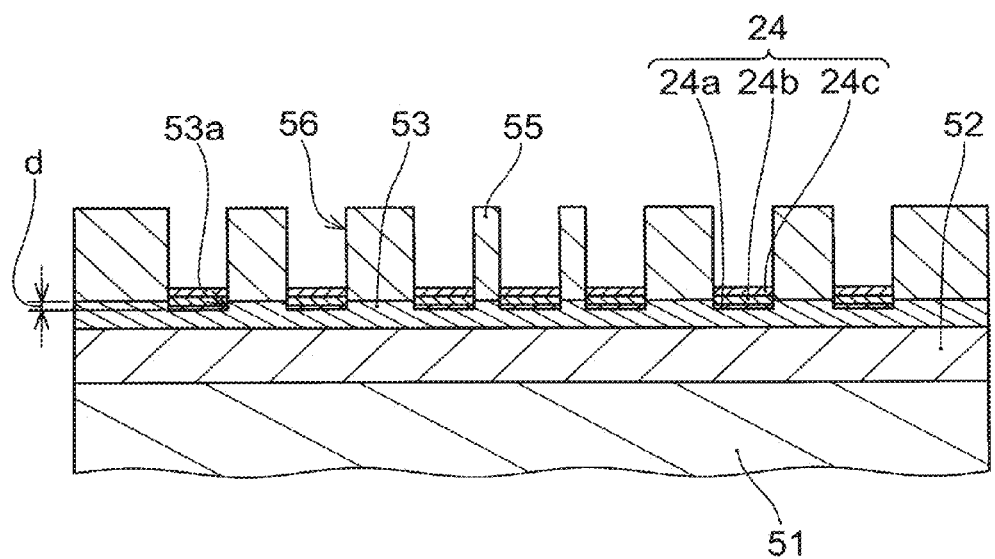

Next, a plating layer is formed in each of the recesses (53*a*) by electrolytic plating using the metal film 53 as a seed layer. By laminating multiple metal layers composed of dissimilar metals, a dissimilar metal layer 24 is formed in each of the recesses (53*a*). That is, the first conductor pads 22 and the second conductor pads 23 are formed. In the printed wiring boards (100, 101) of FIGS. 3 and 5, the dissimilar metal layers 24 that respectively form the first conductor pads 22 and the second conductor pads 23 are each formed by three metal layers. As illustrated in FIG. 9B, the base plate 51 side portions of the dissimilar metal layers 24 are respectively formed in the recesses (53*a*). The first metal layer (24*a*) is formed on the bottom surface of each of the recesses (53*a*); the second metal layer (24*b*) is formed on the first metal layer (24*a*); and the third metal layer (24*c*) is formed on the second metal layer (24*b*). The first metal layer (24*a*), the second metal layer (24*b*) and the third metal layer (24*c*) are respectively formed, for example, by gold, nickel and copper plating layers. However, the materials of the metal layers are not limited to these. The materials of the metal layers may also be other metals. It is possible that, on the first metal layer (24*a*), at least one metal layer composed of a metal different from that of the first metal layer is formed. Further, FIG. 9B illustrates an example in which the first metal layer (24*a*) is formed thinner than other metal layers. However, it is also possible that the metal layers are formed to have the same thickness.

As illustrated in FIG. 9B, the dissimilar metal layer 24 has a thickness larger than the depth (d) of the recesses (53a). A portion of each of the openings 56 is also filled by the dissimilar metal layer 24.

Figure 9C:
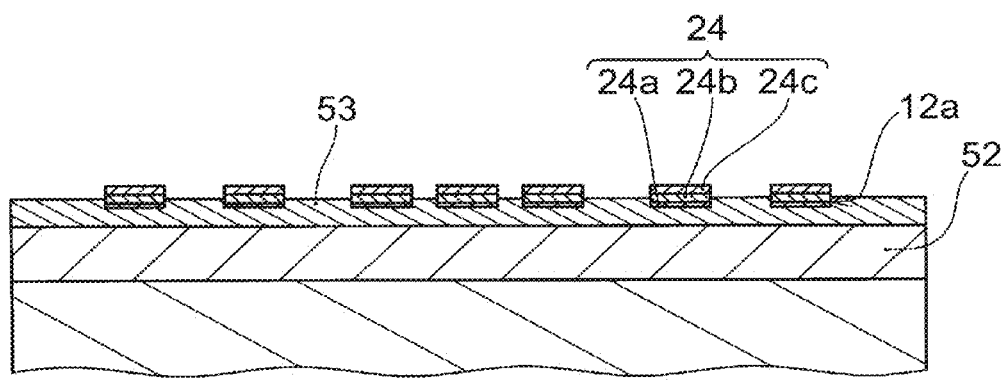

By removing the resist pattern 55, as illustrated in FIG. 9C, the first conductor layer (12a) in a predetermined pattern including the dissimilar metal layers 24 is formed. A portion of each of the dissimilar metal layers 24 protrudes from a surface of the metal film 53 on the opposite side of the carrier copper foil 52. The third metal layer (24c) forms an end portion of the protruding portion of each of the dissimilar metal layers 24 that protrudes from the metal film 53.

Figure 9D:
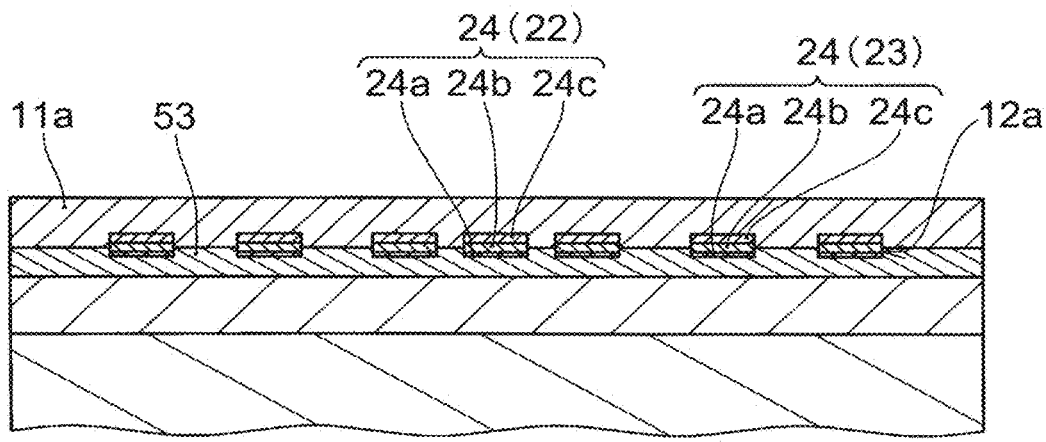

Next, similar to the process of FIG. 7E, the first resin insulating layer (11a) covering the first conductor layer (12a) is formed on the metal film 53 and on the first conductor layer (12a) (see FIG. 9D). The first resin insulating layer (11a) is formed so as to cover exposed surfaces of the first and second conductor pads (22, 23) including portions of side surfaces of the first and second conductor pads (22, 23). That is, the first resin insulating layer (11a) is formed such that the protruding portions of the first conductor pads 22 and the second conductor pads 23 that protrude from the metal film 53 are embedded in the first resin insulating layer (11a).

Figure 9E:
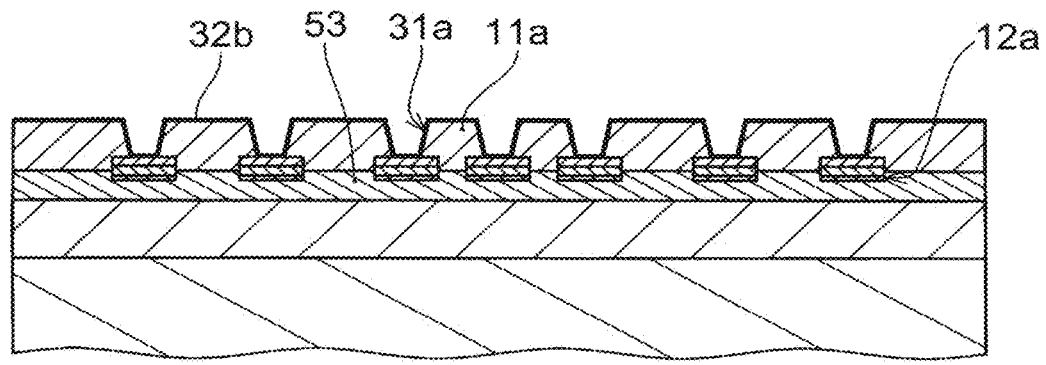
Figure 9F:
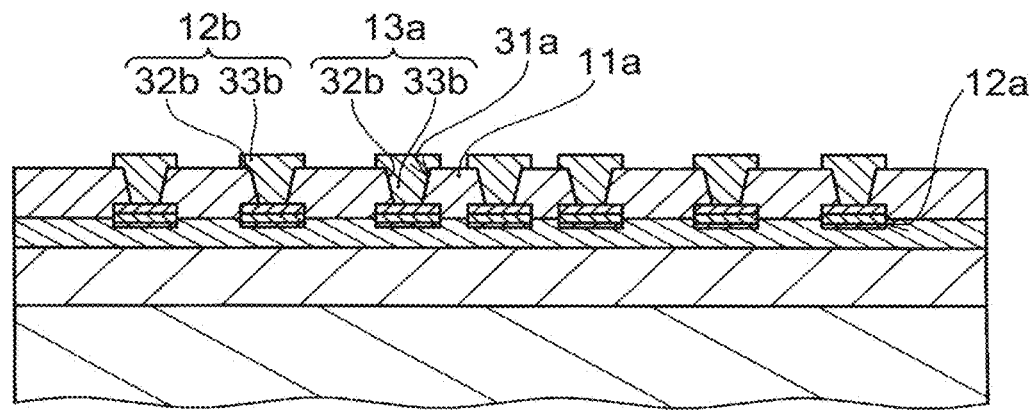
Figure 9G:
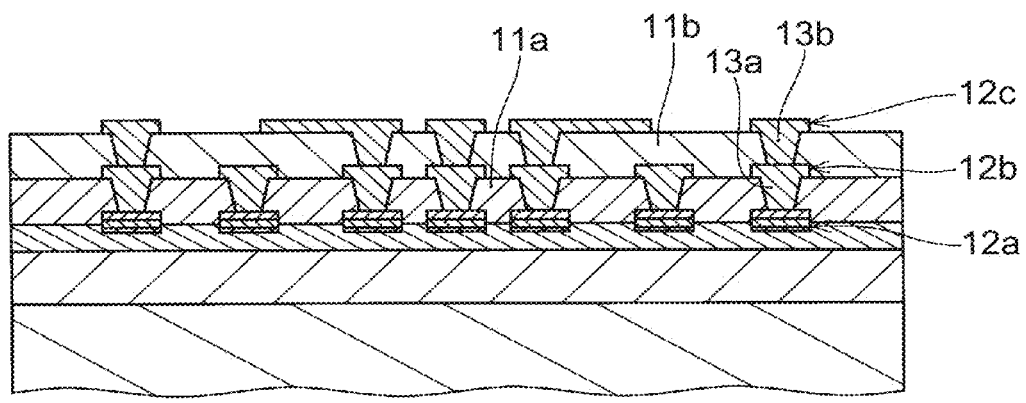
Figure 9H:
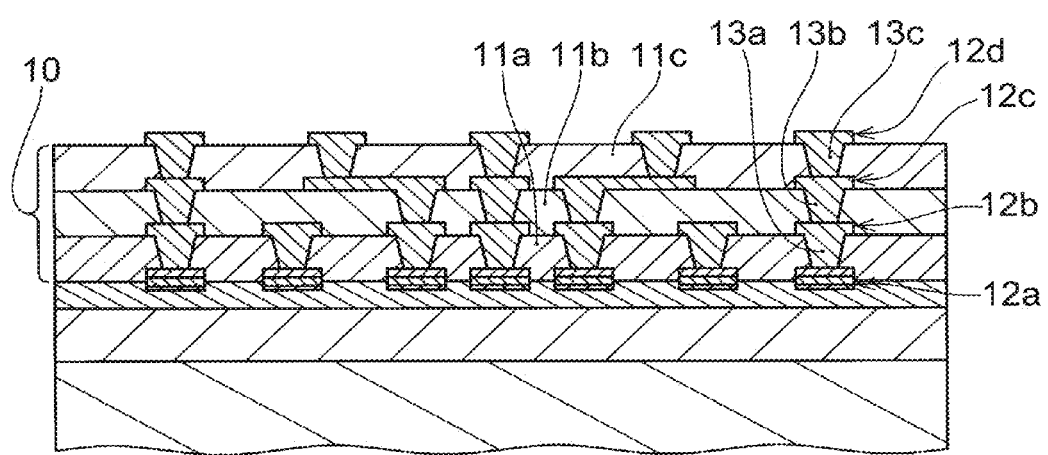

Similar to the process of FIG. 7F, in the first resin insulating layer (11a), the conduction holes (31a) are formed that penetrate the first resin insulating layer (11a) and each have a tapered shape that is gradually reduced in diameter toward the first conductor layer (12a) side (see FIG. 9E). Similar to the processes of FIG. 7F-7G, the metal layer (32b) is formed in the conduction holes (31a) and on the surface of the first resin insulating layer (11a), and the electrolytic plating film (33b) is formed by electrolytic plating using the metal layer (32b) as a seed layer (see FIG. 9F). The metal layer (32b) and the electrolytic plating film (33b) on the first resin insulating layer (11a) form the second conductor layer (12b), and the first via conductors (13a) are formed by the metal layer (32b) and the electrolytic plating film (33b) in the conduction holes (31a). By repeating processes similar to the processes of FIG. 7E-7G, the third conductor layer (12c) and the second resin insulating layer (11b) are formed on the second conductor layer (12b) and the first resin insulating layer (11a); and the fourth conductor layer (12d) and the third resin insulating layer (11c) are formed on the third conductor layer (12c) and the second resin insulating layer (11b) (see FIGS. 9G and 9H). The second via conductors (13b) are formed in the second resin insulating layer (11b); and the third via conductors (13c) are formed in the third resin insulating layer (11c).

Next, similar to the process of FIG. 7J, the support plate 28 is affixed to the fourth conductor layer (12d) of the build-up wiring layer 10 on the first surface (10B) side by the adhesive 29 (see FIG. 9I). Then, similar to the process of FIG. 7K, the base plate 51 and the carrier copper foil 52 are removed, and the metal film 53 is exposed on the entire surface on the second surface (10T) side of the build-up wiring layer 10 (see FIG. 9J).

Figure 9K:
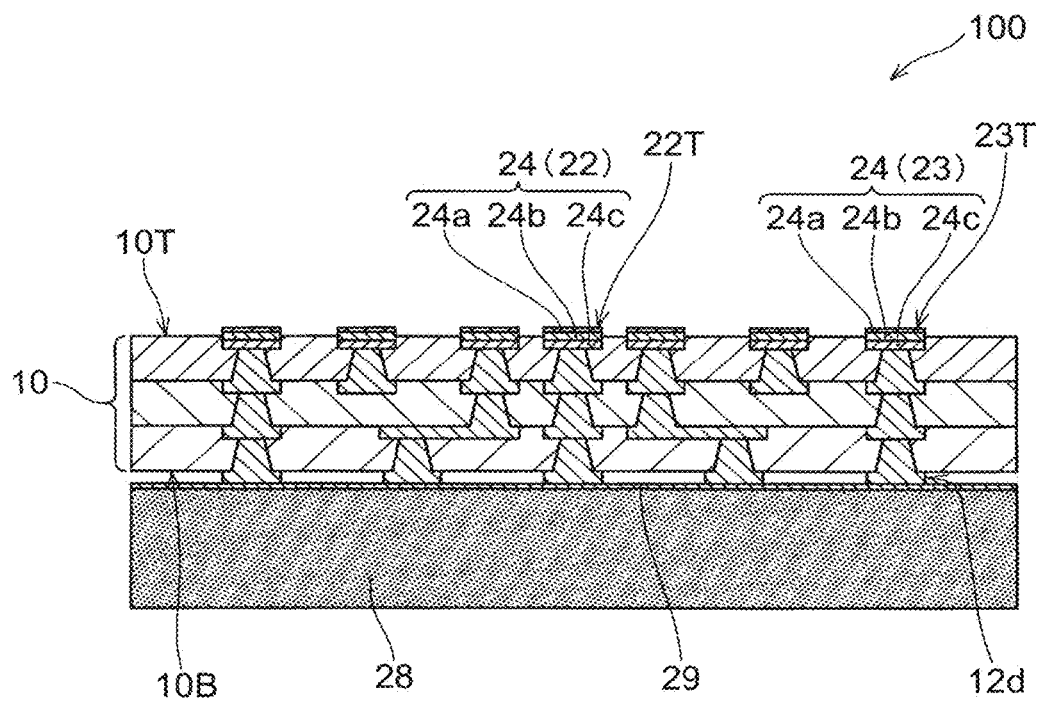

As illustrated in FIG. 9K, the metal film 53 is removed by etching. By the removal, end surfaces (22T, 23T) of the dissimilar metal layers 24 that respectively form the first and second conductor pads (22, 23) on the opposite side of the first surface (10B) are exposed. The printed wiring board 100 illustrated in FIG. 3 is completed. Portions of the dissimilar metal layers 24 including the end surfaces (22T, 23I) protrude from the second surface (10T) of the build-up wiring layer 10. The first and second conductor pads (22, 23) including the portions protruding from the second surface (10T) of the build-up wiring layer 10 are formed. The end surfaces (22T, 23T) of the first and second conductor pads (22, 23) are respectively formed by the first metal layers (24a). That is, for example, a corrosion resistant plating layer composed of highly corrosion resistant gold forms each of the end surfaces (22T, 23T) of the first and second conductor pads (22, 23). For example, since the first conductor pads 22 that are to be connected to an electronic component or the like are formed protruding from the second surface (10T), solder bridging during mounting of the electronic component or the like is unlikely to occur.

The external electronic component (E1) (see FIG. 4) can be mounted to the completed printed wiring board 100. For example, by a process similar to that in FIG. 8B described above, electrodes of the external electronic component (E1) are bonded to the first conductor pads 22 by the bonding members 61 composed of a solder paste or the like. The printed wiring board (100a) illustrated in FIG. 4 is obtained. Further, by a process similar to that of FIG. 8C, after the mounting of the electronic component (E1), the mounted electronic component (E1) and the bonding members 61 on the second surface (10T) of the build-up wiring layer 10 of the printed wiring board (100a) may be sealed using a resin sealing layer. Further, by a process similar to that of FIG. 8D, the support plate 28 may be removed from the build-up wiring layer 10.

Figure 10A:
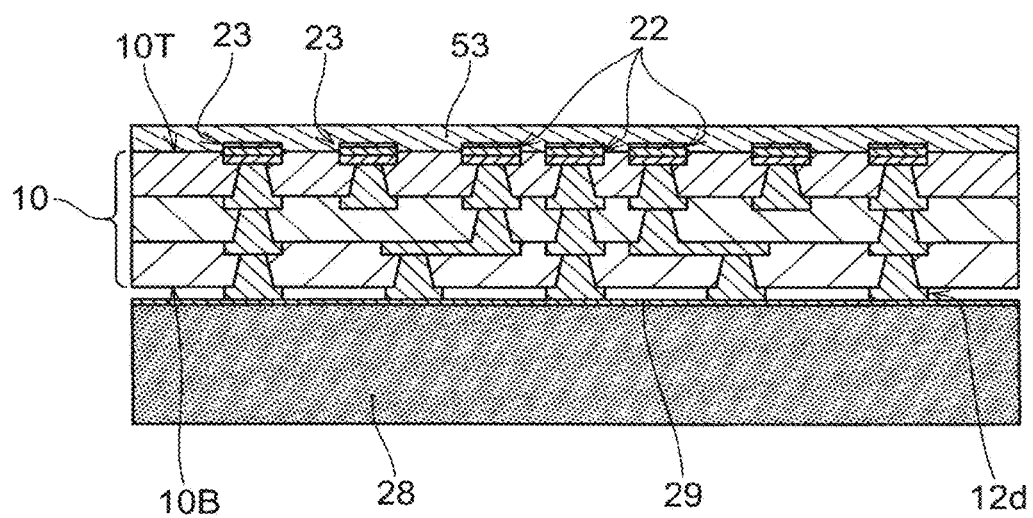
FIG. 10A-10E illustrate a method for manufacturing a printed wiring board according to another embodiment of the present invention.
Figure 10B:
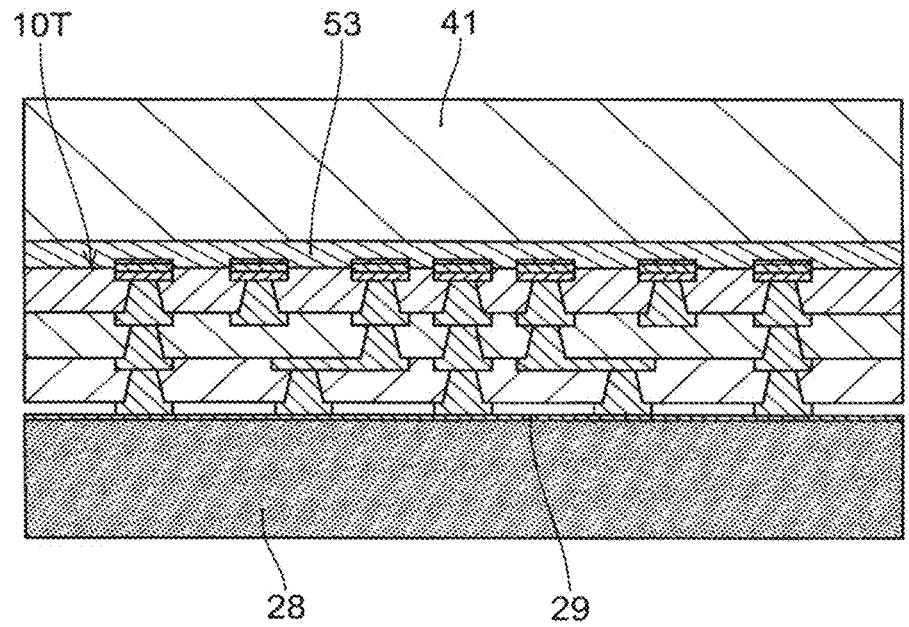
Figure 10C:
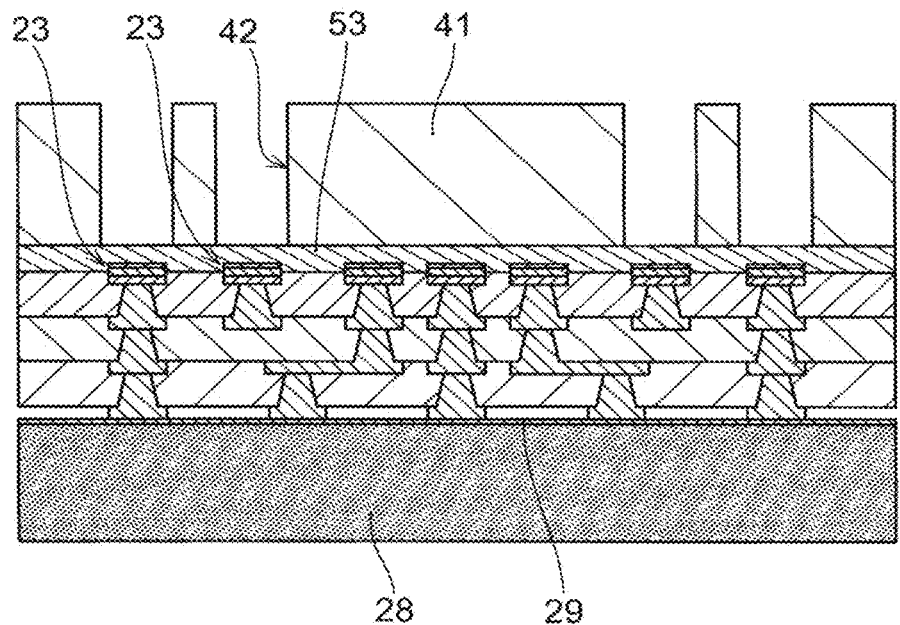
Figure 10D:
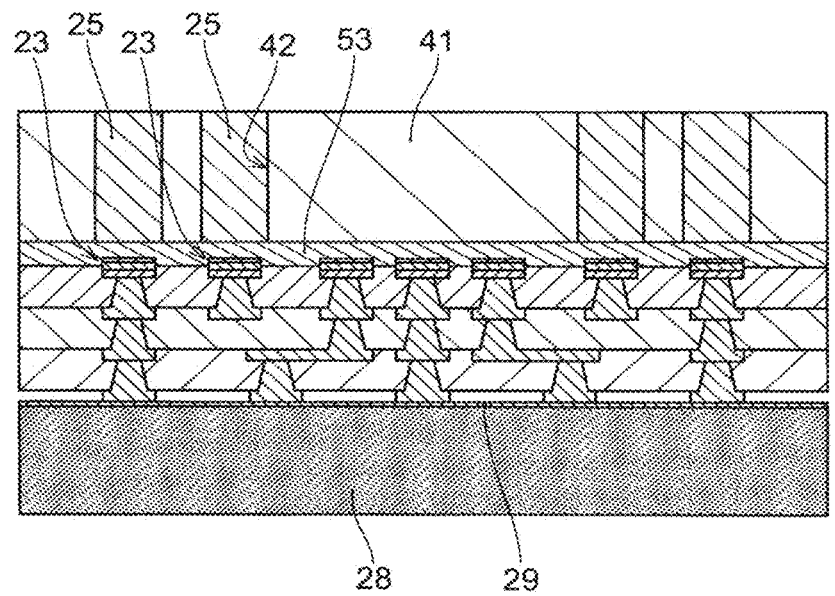

When the printed wiring board 101 illustrated in FIG. 5 is formed, before the metal film 53 is removed (see FIG. 10A), the conductor posts 25 (see FIG. 5) are formed on the second conductor pads 23 that are formed in an outer peripheral portion of the second surface (10T) of the build-up wiring layer 10. First, as illustrated in FIG. 10B, a plating resist layer 41 is formed on the entire surface of the metal film 53. As illustrated in FIG. 10C, openings 42 are formed in the plating resist layer 41 at positions where the conductor posts 25 (see FIG. 5) are to be formed. The metal film 53 on the second conductor pads 23 is exposed on bottom surfaces of the openings 42. The openings 42 are formed, for example, by exposure and development. Therefore, the openings 42 having substantially vertical wall surfaces are formed. The plating resist layer 41 can be formed to have a thickness substantially equal to or slightly larger than the length of the conductor posts 25. By electrolytic plating using the metal film 53 as a power feeding layer, a metal layer is formed on the metal film 53 exposed in the openings 42 of the plating resist layer 41, and as illustrated in FIG. 10D, the conductor posts 25 are respectively formed in the openings 42. The conductor posts 25 are respectively connected to the second conductor pads 23 via the metal film 53. As described above, the openings 42 of the plating resist layer 41 can have substantially vertical wall surfaces. Therefore, the conductor posts 25 can also be each formed with substantially the same width in a height direction.

A material of the conductor posts 25 is not particularly limited. Copper that is inexpensive and low in electric resistance is preferable. Examples of a plating solution for forming the conductor posts 25 composed of copper include a copper sulfate plating solution and the like. The length (L) (thickness of the plating) of the conductor posts 25 can be controlled by a plating time. Therefore, the conductor posts 25 can be formed to have a desired height. Preferably, the conductor posts 25 and metal film 53 are formed of the same material. The conductor posts 25 can be firmly bonded to metal film 53.

Figure 10E:
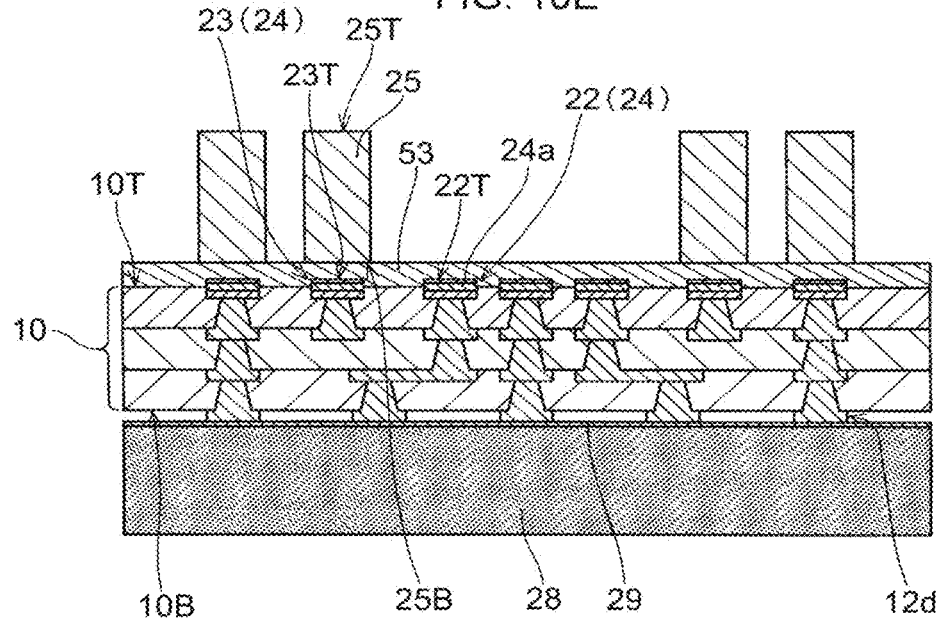

Thereafter, as illustrated in FIG. 10E, the plating resist layer 41 is removed. Next, the metal film 53 exposed by the removal of the plating resist layer 41 is removed by etching. By the removal, the end surfaces (22T) of the dissimilar metal layers 24 that respectively form the first conductor pads 22 on the opposite side o the first surface (10B) are exposed. The portions of the dissimilar metal layers 24 including the end surfaces (22T) protrude from the second surface (10T) of the build-up wiring layer 10. The first conductor pads 22 including the portions protruding from the second surface (10T) of the build-up wiring layer 10 are formed. The diameter of the end surface (25B) of each of the conductor posts 25 is larger than the diameter of the upper surface (23T) of each of the second conductor pads 23. The conductor posts 25 respectively mask portions of the metal film 53 below the conductor posts 25 during the removal of the metal film 53 by etching. Therefore, the metal film 53 remains on the side surfaces of the protruding portions of the second conductor pads 23 that protrude from the second surface (10T) after the removal of the metal film 53. That is, not only the upper surfaces (23T) but also the side surfaces of the second conductor pads 23 are covered by the metal film 53. The conductor posts 25 are directly bonded to the metal film 53 on the upper surfaces (23T) of the second conductor pads 23. Even when a stress due to a thermal stress or the like is applied during a process after the bonding or during the use of the printed wiring board, peeling or breaking is unlikely to occur at an interface of a connecting part between each of the second conductor pads 23 and the metal film 53, or between the metal film 53 and each of the conductor posts 25.

Through the above processes, the printed wiring board 101 illustrated in FIG. 5 is completed. On the completed printed wiring board 101, an electronic component may be connected to the first conductor pads 22, and a motherboard or another printed wiring board (not illustrated in the drawings) may be connected to the end surfaces (25T) of the conductor posts 25 so as to form a part of a semiconductor package.

Figure 11A:
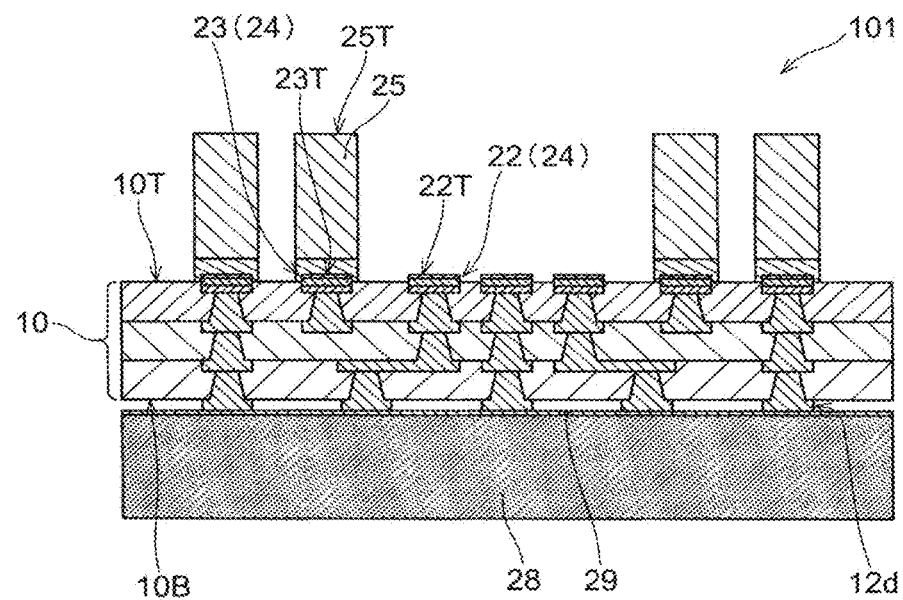
FIG. 11A-11C illustrate a method for manufacturing a printed wiring board according to another embodiment of the present invention.
Figure 11B:
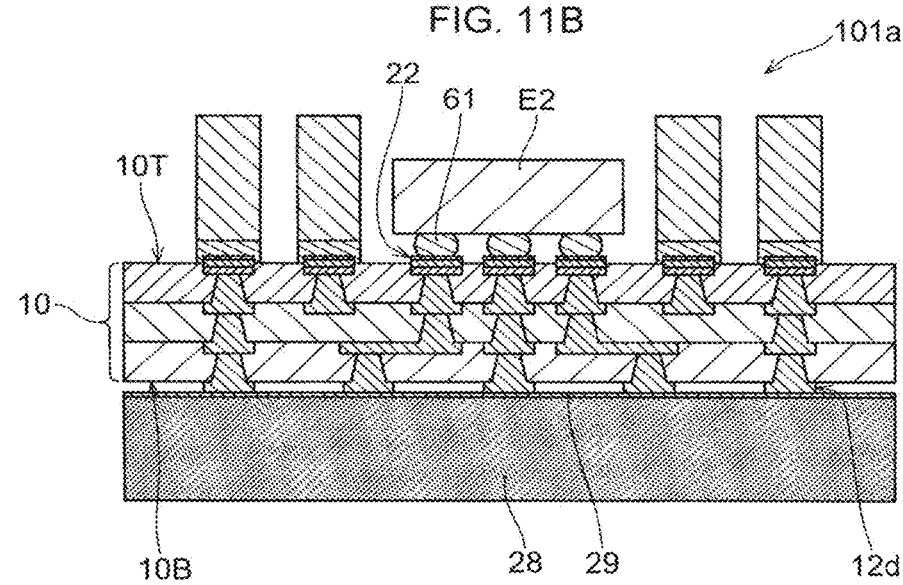
Figure 11C:
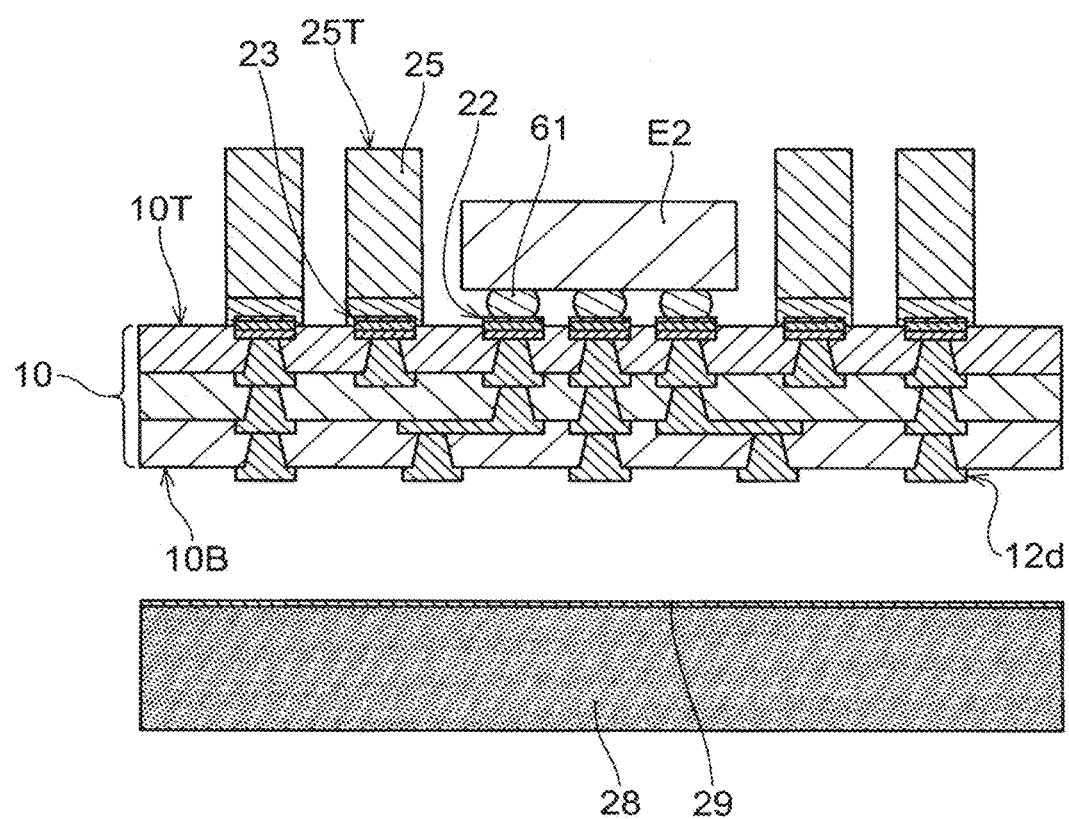

When the printed wiring board (101a) including the electronic component (E2) illustrated in FIG. 6 is manufactured, by a process similar to that of FIG. 8B, electrodes of the external electronic component (E2) are connected to the first conductor pads 22 of the printed wiring board 101 illustrated in FIG. 11A by the bonding members 61 composed of a solder paste or the like (see FIG. 11B). The printed wiring board (101a) illustrated in FIG. 6 is obtained. When necessary, by a process similar to that of FIG. 8C, a resin sealing layer may be formed around the electronic component (E2). Further, by a process similar to that of FIG. 8D, the support plate 28 may be removed from the build-up wiring layer 10 (see FIG. 11C). When an external wiring board (not illustrated in the drawings) is connected on the end surfaces (25T) of the conductor posts 25, for example, terminals of the external wiring board (not illustrated in the drawings) are connected to the conductor posts 25 via solder bumps or the like. The connection of the external connection board may also be performed with respect to the conductor posts 25 of the build-up wiring layer 10 on the support plate 28. That is, the support plate 28 may be removed from the build-up wiring layer 10 after the external electronic component (E2) and the external wiring board are mounted on the printed wiring board 101.

Since the multilayer wiring board of Japanese Patent Laid-Open Publication No. 2009-224739 does not have a core substrate, during mounting of a semiconductor element or the like, warping is likely to occur. It is likely to be difficult to stably mount a semiconductor element with good connection quality. Further, pads that connect a semiconductor element are formed protruding from the insulating layer having a mounting surface for a semiconductor element. The multilayer wiring board as a whole is likely to become thick. Further, since there is no insulating material between the pads, from a point of view of suppressing a short-circuit risk between pads, it is likely to be difficult to form the pads at a fine pitch.

A printed wiring board according to an embodiment of the present invention includes a build-up wiring layer having a first surface and a second surface that is on the opposite side of the first surface, resin insulating layers and conductor layers being alternately laminated in the build-up wiring layer. The build-up wiring layer includes first conductor pads that are embedded in a first resin insulating layer that forms the second surface, one surface of each of the first conductor pads being exposed from the second surface. A support plate is provided on the first surface of the build-up wiring layer.

A method for manufacturing a printed wiring board according to an embodiment of the present invention includes: preparing a base plate, a metal film being provided on a surface of the base plate; forming a metal layer including multiple conductor pads on the metal film; forming a build-up wiring layer having a second surface facing the metal film and a first surface that is on the opposite side of the second surface by forming, on the metal film, a resin insulating layer covering exposed surfaces of the conductor pads including side surfaces and further laminating at least one conductor layer on the resin insulating layer; removing the base plate; bonding a support plate on the first surface of the build-up wiring layer; and exposing one surface of each of the conductor pads on the opposite side of the support plate by removing the metal film.

According to an embodiment of the present invention, since the support plate is provided, warping or the like in the printed wiring board is suppressed, and an electronic component can be stably mounted on the conductor pads. Further, the conductor pads can be arrayed at a fine pitch on the surface on the opposite side of the support plate. Since the side surfaces of the conductor pads are covered by the first resin insulating layer, even when the conductor pads are formed at a fine pitch, a short circuit failure is unlikely to occur. Connection reliability between an electronic component and the printed wiring board is expected to be high.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
a support plate; and
a build-up wiring layer comprising a plurality of resin insulating layers and a plurality of conductor layers and having a first surface and a second surface on an opposite side with respect to the first surface such that the support plate is positioned on the first surface of the build-up wiring layer,
wherein the plurality of resin insulating layers in the build-up wiring layer includes a first resin insulating layer that forms the second surface of the build-up wiring layer, the build-up wiring layer includes a plurality of first conductor pads embedded in the first resin insulating layer such that each of the first conductor pads has an exposed surface exposed from the second surface of the build-up wiring layer, and a plurality of via conductors formed in the plurality of resin insulating layers such that diameters of the via conductors are reducing from the first surface toward the second surface of the build-up wiring layer, each of the first conductor pads comprises a dissimilar metal layer comprising a plurality of metal layers such that the metal layers are formed of different metals with respect to each other, and the dissimilar metal layer comprises a copper plating layer and a corrosion resistant plating layer formed on the copper plating layer.

2. The printed wiring board according to claim 1, wherein each of the first conductor pads has a protruding portion protruding from the second surface of the build-up wiring layer.

3. The printed wiring board according to claim 2, wherein each of the first conductor pads has the protruding portion protruding from the second surface of the build-up wiring layer such that a height h of the protruding portion relative to the second surface is in a range of 2 µm to 10 µm.

4. The printed wiring board according to claim 1, wherein the plurality of first conductor pads is formed in a center portion of the second surface of the build-up wiring layer, and the build-up wiring layer includes a plurality of second conductor pads formed in an outer peripheral portion of the second surface of the build-up wiring layer, and a plurality of conductor posts formed on the second conductor pads respectively such that each of the conductor posts is formed on a respective one of the second conductor pads via a metal film.

5. The printed wiring board according to claim 4, wherein each of the second conductor pads comprises a dissimilar metal layer comprising a plurality of metal layers such that the metal layers are formed of different metals with respect to each other, the dissimilar metal layer of each of the second conductor pads comprises a copper plating layer and a corrosion resistant plating layer formed on the copper plating layer, and each of the second conductor pads has a protruding portion protruding from the second surface of the build-up wiring layer.

6. The printed wiring board according to claim 4, wherein the plurality of first conductor pads and the plurality of second conductor pads are formed such that a pitch between the first conductor pads is smaller than a pitch between the second conductor pads.

7. The printed wiring board according to claim 4, wherein the plurality of conductor posts is formed such that each of the conductor posts has a length in a range of 50 µm to 200 µm.

8. The printed wiring board according to claim 4, wherein the plurality of conductor posts is formed such that each of the conductor posts has a diameter which is greater than a diameter of the respective one of the second conductor pads.

9. The printed wiring board according to claim 1, wherein the plurality of resin insulating layers in the build-up wiring layer includes a resin insulating layer that forms the first surface of the build-up wiring layer, and the plurality of conductor layers includes a conductor layer formed on the resin insulating layer forming the first surface of the build-up wiring layer.

10. The printed wiring board according to claim 1, further comprising:
an electronic component mounted to the plurality of first conductor pads such that the electronic component is positioned on the second surface of the build-up wiring layer.

11. A printed wiring board, comprising:
a support plate; and
a build-up wiring layer comprising a plurality of resin insulating layers and a plurality of conductor layers and having a first surface and a second surface on an opposite side with respect to the first surface such that the support plate is positioned on the first surface of the build-up wiring layer,
wherein the plurality of resin insulating layers in the build-up wiring layer includes a first resin insulating layer that forms the second surface of the build-up wiring layer, the build-up wiring layer includes a plurality of first conductor pads embedded in the first resin insulating layer such that each of the first conductor pads has an exposed surface exposed from the second surface of the build-up wiring layer, and a plurality of via conductors formed in the plurality of resin insulating layers such that diameters of the via conductors are reducing from the first surface toward the second surface of the build-up wiring layer, each of the first conductor pads comprises a dissimilar metal layer comprising a plurality of metal layers such that the metal layers are formed of different metals with respect to each other, and each of the first conductor pads has a protruding portion protruding from the second surface of the build-up wiring layer such that a height h of the protruding portion relative to the second surface is in a range of 2 µm to 10 µm.

12. The printed wiring board according to claim 11, wherein the plurality of first conductor pads is formed in a center portion of the second surface of the build-up wiring layer, and the build-up wiring layer includes a plurality of second conductor pads formed in an outer peripheral portion of the second surface of the build-up wiring layer, and a plurality of conductor posts formed on the second conductor pads respectively such that each of the conductor posts is formed on a respective one of the second conductor pads via a metal film.

13. The printed wiring board according to claim 12, wherein each of the second conductor pads comprises a dissimilar metal layer comprising a plurality of metal layers such that the metal layers are formed of different metals with respect to each other, the dissimilar metal layer of each of the second conductor pads comprises a copper plating layer and a corrosion resistant plating layer formed on the copper plating layer, and each of the second conductor pads has a protruding portion protruding from the second surface of the build-up wiring layer.

14. The printed wiring board according to claim 12, wherein the plurality of first conductor pads and the plurality of second conductor pads are formed such that a pitch between the first conductor pads is smaller than a pitch between the second conductor pads.

15. The printed wiring board according to claim 12, wherein the plurality of conductor posts is formed such that each of the conductor posts has a diameter which is greater than a diameter of the respective one of the second conductor pads.

16. A printed wiring board, comprising:
a support plate; and
a build-up wiring layer comprising a plurality of resin insulating layers and a plurality of conductor layers and having a first surface and a second surface on an opposite side with respect to the first surface such that the support plate is positioned on the first surface of the build-up wiring layer,
wherein the plurality of resin insulating layers in the build-up wiring layer includes a first resin insulating layer that forms the second surface of the build-up wiring layer, the build-up wiring layer includes a plurality of first conductor pads embedded in the first resin insulating layer such that each of the first conductor pads has an exposed surface exposed from the second surface of the build-up wiring layer, and a plurality of via conductors formed in the plurality of resin insulating layers such that diameters of the via conductors are reducing from the first surface toward the second surface of the build-up wiring layer, the plurality of first conductor pads is formed in a center portion of the second surface of the build-up wiring layer, and the build-up wiring layer includes a plurality of second conductor pads formed in an outer peripheral portion of the second surface of the build-up wiring layer, and a plurality of conductor posts formed on the second conductor pads respectively such that each of the conductor posts is formed on a respective one of the second conductor pads via a metal film.

17. The printed wiring board according to claim 16, wherein each of the second conductor pads comprises a dissimilar metal layer comprising a plurality of metal layers such that the metal layers are formed of different metals with respect to each other, the dissimilar metal layer of each of the second conductor pads comprises a copper plating layer and a corrosion resistant plating layer formed on the copper plating layer, and each of the second conductor pads has a protruding portion protruding from the second surface of the build-up wiring layer.

18. The printed wiring board according to claim 16, wherein the plurality of first conductor pads and the plurality of second conductor pads are formed such that a pitch between the first conductor pads is smaller than a pitch between the second conductor pads.

19. The printed wiring board according to claim 16, wherein the plurality of conductor posts is formed such that each of the conductor posts has a diameter which is greater than a diameter of the respective one of the second conductor pads.

20. The printed wiring board according to claim 16, wherein each of the first conductor pads comprises a dissimilar metal layer comprising a plurality of metal layers such that the metal layers are formed of different metals with respect to each other.

* * * * *